(12) United States Patent
Hidaka et al.

(10) Patent No.: US 9,355,210 B2
(45) Date of Patent: May 31, 2016

(54) METHOD FOR DERIVING EQUIVALENT CIRCUIT MODEL OF CAPACITOR

(71) Applicant: MURATA MANUFACTURING CO., LTD., Kyoto-fu (JP)

(72) Inventors: Seiji Hidaka, Kyoto-fu (JP); Atsushi Sakuragi, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 14/491,756

(22) Filed: Sep. 19, 2014

(65) Prior Publication Data

US 2015/0012899 A1    Jan. 8, 2015

Related U.S. Application Data

(63) Continuation of application No. PCT/JP2013/054823, filed on Feb. 25, 2013.

(30) Foreign Application Priority Data

Apr. 4, 2012    (JP) .................................. 2012-085478

(51) Int. Cl.
*G06F 9/455*    (2006.01)
*G06F 17/50*    (2006.01)
(Continued)

(52) U.S. Cl.
CPC ........ *G06F 17/5081* (2013.01); *G06F 17/5036* (2013.01); *H01G 4/12* (2013.01); *H01G 4/30* (2013.01)

(58) Field of Classification Search
USPC ................................................ 716/106, 107
See application file for complete search history.

(56) References Cited

U.S. PATENT DOCUMENTS 7,474,999 B2 *   1/2009   Scheffer .......................... 703/14
2003/0173979 A1   9/2003   Maeshima et al.
(Continued)

FOREIGN PATENT DOCUMENTS

| JP | 2002-259482 A | 9/2002 |
| JP | 2012-003409 A | 1/2012 |
| WO | 2012/090602 A1 | 7/2012 |

OTHER PUBLICATIONS

John D. Prymark "SPICE Modeling of Capacitors" Kemet electronics Corp., CARTS, 1995, Components Technology Institute, Inc.*
(Continued)

*Primary Examiner* — Brian Ngo
(74) *Attorney, Agent, or Firm* — Studebaker & Brackett PC

(57) ABSTRACT

A method for deriving an equivalent circuit model of a capacitor which makes it possible to derive, with high accuracy and with ease, an equivalent circuit model having characteristics in accordance with a direct current voltage applied to a capacitor. Characteristic values of predetermined resistive elements and capacitive elements forming an equivalent circuit model of a capacitor change in response to a DC bias voltage being applied to the capacitor, and the change is attributable to the material of a dielectric forming the capacitor. However, by multiplying the characteristic values of the resistive elements and the capacitive elements held while the DC bias voltage is not applied by a dimensionless coefficient in accordance with an application rule, the characteristic values of the resistive elements and the capacitive elements are corrected to values in accordance with the voltage of the DC bias voltage applied to the capacitor.

6 Claims, 17 Drawing Sheets

(51) Int. Cl.
*H01G 4/30* (2006.01)
*H01G 4/12* (2006.01)

(56) References Cited

U.S. PATENT DOCUMENTS

2011/0307235 A1 12/2011 Wu
2012/0185223 A1* 7/2012 Wu .................................. 703/2

OTHER PUBLICATIONS

John D. Prymark "Capacitor EDA Models with Compensations for Frequency, Temperature, and DC Bias" Kemet electronics Corp., CARTS Conference, Mar. 2010.*
International Search Report; PCT/JP2013/054823; Mar. 26, 2013.
Written Opinion of the International Searching Authority; PCT/JP2013/054823; Mar. 26, 2013.
Prymak, John D. "Spice Modeling of Capacitors", CARTS, Components Technology Institute, Inc. [online], 1995, pp. 1-5, [retrieval date Mar. 12, 2013], Internet <URL: http://www.kemet.com/kemet/web/homepage/kfbk3.nsf/vaFeedbackFAQ/BF2C1E6AF9D9BB3085257225006B3082/$file/1995%20CARTS%20-%20SPICE.pdf>.
The extended European search report issued by the European Patent Office on Dec. 9, 2015, which corresponds to European Patent Application No. 13772567.7-1954 and is related to U.S. Appl. No. 14/491,756.
M. Andersson; "Equivalent Circuit Models for Discrete Passive Components"; Oct. 20-23, 2008; pp. 1-9; CARTS Europe; Helsinki, Finland.
M.D. Waugh; "Design solutions for DC bias in multilayer ceramic capacitors"; Aug. 2010; pp. 34-36; Electronic Engineering Times: Design & Products; Europe.
H.P. Jeon et al.; "Non-linear behavior of multilayer ceramic capacitors with a new equivalent circuit under AC-fields"; Journal of Ceramic Processing Research; 2007; pp. 229-232; vol. 8; No. 4.

* cited by examiner

METHOD FOR DERIVING EQUIVALENT CIRCUIT MODEL OF CAPACITOR

CROSS REFERENCE TO RELATED APPLICATIONS

This application claims benefit of priority to Japanese Patent Application 2012-085478 filed on Apr. 4, 2012, and to International Patent Application No. PCT/JP2013/054823 filed on Feb. 25, 2013, the entire content of each of which is incorporated herein by reference.

TECHNICAL FIELD

The present technical field relates to methods for deriving equivalent circuit models of capacitors that are formed by a resistive element, a capacitive element, and an inductive element.

BACKGROUND

Conventionally, such a method for deriving an equivalent circuit model of a capacitor is used in a circuit simulation for designing an electronic circuit. Circuit simulators, such as SPICE (Simulation Program with Integrated Circuit Emphasis), are used for circuit simulations, and some circuit simulators are available for use on websites of electronic component manufacturers. Users access the websites of the electronic component manufacturers from terminals, such as a personal computer, through the Internet and use the circuit simulators.

Disclosed in Japanese Unexamined Patent Application Publication No. 2002-259482, for example, is an existing method for deriving an equivalent circuit model of a capacitor. According to this method for deriving an equivalent circuit model, given frequency characteristics of a capacitor are input in a first step, and, in a second step, one of an RC circuit, an RL circuit, and an RCL circuit is formed as an equivalent circuit model, or a circuit that can be simulated in a time domain, by using a resistance (R), a capacitance (C), and an inductance (L) that are not dependent on the frequency. Then, in a third step, an evaluation function is composed for determining the accuracy of the equivalent circuit model formed in the second step, and, in a fourth step, the evaluation function composed in the third step is minimized so as to determine a circuit constant.

According to Japanese Unexamined Patent Application Publication No. 2002-259482, through the configuration described above, such an equivalent circuit model of a capacitor, of which an impedance is indicated in a frequency domain, that can be simulated in a time domain is derived, and the electrical characteristics of the capacitor in the frequency domain or in the time domain are predicted through a circuit simulation.

SUMMARY

Technical Problem

Depending on the material of a capacitor, characteristic values, such as electrostatic capacity, change in accordance with a DC (direct current) bias voltage that is superimposed and applied to the capacitor, and that change cannot be ignored in a circuit simulation. With the existing method for deriving an equivalent circuit model of a capacitor disclosed in Japanese Unexamined Patent Application Publication No. 2002-259482, however, the aforementioned change in the characteristics arising in the capacitor when the DC bias voltage is superimposed and applied to the capacitor is not reflected on the derived equivalent circuit model of the capacitor.

Therefore, with the existing method for deriving an equivalent circuit model of a capacitor, an equivalent circuit model needs to be derived for each value of the DC bias voltage superimposed and applied to the capacitor. In addition, there is not a clear continuity or relationship between each equivalent circuit model derived for each value of the DC bias voltage and an equivalent circuit model obtained for a zero bias in which the DC bias voltage is not applied, and it is difficult to continuously foresee the change in the characteristics arising while the DC bias voltage up to its rated voltage is applied to the capacitor.

Solution to Problem

The present disclosure has been made to solve such a problem. In a method for deriving an equivalent circuit model of a capacitor that is formed by a resistive element, a capacitive element, and an inductive element a rate of change in a characteristic value of the element of which the characteristic value changes as a direct current voltage is applied to the capacitor is expressed as a dimensionless coefficient on the basis of a rate of change in the characteristics of the capacitor attributable to a material of the capacitor. The characteristic value of the element, of which the characteristic value changes in response to the direct current voltage being applied to the capacitor, held while the direct current voltage is not applied is multiplied by the dimensionless coefficient. The characteristic value of the element is corrected to a value in accordance with the direct current voltage applied to the capacitor.

According to the configuration described above, by multiplying the characteristic value of an element, namely, a resistive element, a capacitive element, or an inductive element which forms the equivalent circuit model of the capacitor and of which the characteristic value changes in response to the direct current voltage being applied to the capacitor, held while the direct current voltage is not applied by the dimensionless coefficient, the characteristic value of the element forming the equivalent circuit model of the capacitor can be corrected to a value in accordance with the direct current voltage applied to the capacitor. Therefore, unlike the existing method for deriving an equivalent circuit model of a capacitor, an equivalent circuit model does not need to be derived for each value of the direct current voltage superimposed and applied to the capacitor, and the equivalent circuit model provided with characteristics in accordance with the direct current voltage superimposed and applied to the capacitor can be derived with high accuracy and with ease.

In addition, in the present disclosure, the equivalent circuit model is formed by a resonant circuit serving as a circuit element, and the resonant circuit is formed by a resistive element, a capacitive element, and an inductive element.

The characteristics of the capacitor change around the self resonant frequency or the secondary resonant frequency exceeding the self resonant frequency. According to the configuration described above, however, the equivalent circuit model is formed by the resonant circuit serving as a circuit element, and the resonant circuit is formed by a resistive element, a capacitive element, and an inductive element. Thus, the change in the characteristics can be simulated accurately.

In addition, in the present disclosure, the equivalent circuit model is formed by one of a main resonant circuit, a secondary resonant circuit, a capacitive circuit, and an inductive circuit. The main resonant circuit is formed by connecting a resistive element, a capacitive element, and an inductive element in series. The secondary resonant circuit is formed by connecting a resistive element, a capacitive element, and an inductive element in parallel. The capacitive circuit is formed by connecting a resistive element and a capacitive element in parallel. The inductive circuit is formed by connecting a resistive element and an inductive element in parallel. Alternatively, the equivalent circuit model is formed by connecting some of the main resonant circuit, the secondary resonant circuit, the capacitive circuit, and the inductive circuit in series.

Through the configuration described above, with regard to the characteristics of the capacitor simulated through the equivalent circuit model, as the equivalent circuit model is formed so as to include the main resonant circuit in which a resistive element, a capacitive element, and an inductive element are connected in series, in accordance with the material of the capacitor, the characteristics at a frequency around the self resonant frequency are corrected appropriately. Additionally, as the equivalent circuit model is formed so as to include the capacitive circuit in which a resistive element and a capacitive element are connected in parallel, in accordance with the material of the capacitor, the characteristics at a frequency toward a lower frequency side of the self resonant frequency are corrected appropriately. In addition, as the equivalent circuit model is formed so as to include the secondary resonant circuit in which a resistive element, a capacitive element, and an inductive element are connected in parallel, in accordance with the material of the capacitor, the characteristics at a frequency around the secondary resonant frequency exceeding the self resonant frequency are corrected appropriately. Furthermore, as the equivalent circuit model is formed so as to include the inductive circuit in which a resistive element and an inductive element are connected in parallel, in accordance with the material of the capacitor, the characteristics at a frequency toward a higher frequency side of the self resonant frequency are corrected appropriately.

In addition, in the present disclosure, the equivalent circuit model is formed by one of a main resonant circuit, a secondary resonant circuit, a capacitive circuit, and an inductive circuit. The main resonant circuit is formed by connecting a resistive element, a capacitive element, and an inductive element in parallel. The secondary resonant circuit is formed by connecting a resistive element, a capacitive element, and an inductive element in series. The capacitive circuit is formed by connecting a resistive element and a capacitive element in series. The inductive circuit is formed by connecting a resistive element and an inductive element in series. Alternatively, the equivalent circuit model is formed by connecting some of the main resonant circuit, the secondary resonant circuit, the capacitive circuit, and the inductive circuit in parallel.

Through the configuration described above, with regard to the characteristics of the capacitor simulated through the equivalent circuit model, as the equivalent circuit model is formed so as to include the main resonant circuit in which a resistive element, a capacitive element, and an inductive element are connected in parallel, in accordance with the material of the capacitor the characteristics at a frequency around the self resonant frequency are corrected appropriately. Additionally, as the equivalent circuit model is formed so as to include the capacitive circuit in which a resistive element and a capacitive element are connected in series, in accordance with the material of the capacitor, the characteristics at a frequency toward a lower frequency side of the self resonant frequency are corrected appropriately. In addition, as the equivalent circuit model is formed so as to include the secondary resonant circuit in which a resistive element, a capacitive element, and an inductive element are connected in series, in accordance with the material of the capacitor the characteristics at a frequency around the secondary resonant frequency exceeding the self resonant frequency are corrected appropriately. Furthermore, as the equivalent circuit model is formed so as to include the inductive circuit in which a resistive element and an inductive element are connected in series, in accordance with the material of the capacitor the characteristics at a frequency toward a higher frequency side of the self resonant frequency are corrected appropriately.

In addition, in the present disclosure, the dimensionless coefficient is expressed for the capacitive element or the resistive element, of which the characteristic value changes in response to the direct current voltage being applied to the capacitor, on the basis of one or both of a rate of change in the capacitance and a rate of change in the dielectric loss of the capacitor measured by applying the direct current voltage to the capacitor, and the correction is carried out by multiplying a capacitance value of the capacitive element, of which the capacitance value changes in response to the direct current voltage being applied to the capacitor, held while the direct current voltage is not applied or a resistance value of the resistive element, of which the resistance value changes in response to the direct current voltage being applied to the capacitor, held while the direct current voltage is not applied by the dimensionless coefficient.

Through the configuration described above, the dimensionless coefficient is expressed for the capacitive element or the resistive element, of which the characteristic value changes in response to the direct current voltage being applied to the capacitor, and the characteristic value of the capacitance value or the resistance value is corrected appropriately to a value in accordance with the direct current voltage superimposed and applied to the capacitor by multiplying the characteristic value held while the direct current voltage is not applied to the capacitor by the dimensionless coefficient.

In addition, in the present disclosure, the rate of change in the characteristic value of the element is expressed as an approximate function of the direct current voltage applied to the capacitor.

Through the configuration described above, the characteristic value of an element, namely, a resistive element, a capacitive element, or an inductive element forming the equivalent circuit model of the capacitor has its rate of change expressed as an approximate function of the direct current voltage applied to the capacitor, and thus values obtained discretely through the measurement are complemented and can be grasped continuously from the characteristic value held while the direct current voltage is not applied. Therefore, in each of the equivalent circuit models derived in accordance with the direct current voltage superimposed and applied to the capacitor, the continuity or the relationship with the equivalent circuit model obtained when the direct current voltage is not applied becomes clear, and thus the change in the characteristics arising while the direct current voltage is applied to the capacitor up to the rated voltage thereof can be foreseen continuously.

In addition, in the present disclosure, the approximate function is expressed within a direct current voltage range that ranges from a rated voltage of the capacitor or lower to zero or higher, and a function value always takes a positive value and becomes 1 when the direct current voltage applied to the capacitor is zero.

Through the configuration described above, the rate of change in the characteristic value of the element forming the equivalent circuit model of the capacitor is expressed through an approximate function in accordance with the actual use of the capacitor, and thus an appropriate circuit simulation can be carried out in accordance with the actual use.

In addition, in the present disclosure, a computer program that causes one of the above-described methods for deriving an equivalent circuit model of a capacitor to function is formed, and the computer program includes a first step of inputting a type of the capacitor, a second step of inputting a value of a direct current voltage to be applied to the capacitor, and a third step of multiplying a characteristic value of the element forming the equivalent circuit model of the capacitor of the type inputted in the first step held while the direct current voltage is not applied by a dimensionless coefficient prepared in advance for the capacitor of the type inputted in the first step and correcting the characteristic value of the element to a value in accordance with the direct current voltage inputted in the second step.

Through the configuration described above, as the type of the capacitor to be simulated and the value of the direct current voltage to be applied to the capacitor are inputted to the computer program, one of the above-described methods for deriving the equivalent circuit model of the capacitor is made function through the computer program. Therefore, the characteristic value of the element forming the equivalent circuit model of the capacitor of the inputted type is automatically corrected through the computer program to a value in accordance with the inputted value of the direct current voltage as the characteristic value held while the direct current voltage is not applied is multiplied by the dimensionless coefficient prepared in advance for the capacitor of the inputted type. Therefore, a user of the deriving method can carry out, with high accuracy and with ease, an appropriate circuit simulation only by inputting the type of the capacitor to be simulated and the value of the direct current voltage to be applied to the capacitor to the computer program. As a result, even a general user who does not have specialized knowledge on a circuit simulation can carry out an appropriate circuit simulation for an electronic circuit that includes the capacitor with high accuracy and with ease.

In addition, in the present disclosure, a method for using the computer program is formed, and the method includes accessing a server provided with the computer program though the Internet, and using the computer program from a terminal connected to the Internet.

Through the configuration described above, the user can use the computer program with ease by accessing the server provided with the computer program from a terminal connected to the Internet. Accordingly, the method for deriving the equivalent circuit model of the capacitor according to the present disclosure can be provided to a large number of users.

Advantageous Effects of Disclosure

According to the present disclosure, as described above, an equivalent circuit model having characteristics in accordance with a direct current voltage to be superimposed and applied to a capacitor can be derived with high accuracy and with ease. In addition, in each of the equivalent circuit models derived in accordance with the direct current voltage superimposed and applied to the capacitor, the continuity or the relationship with the equivalent circuit model obtained when the direct current voltage is not applied becomes clear, and thus the change in the characteristics arising while the direct current voltage is applied to the capacitor up to the rated voltage thereof can be foreseen continuously.

BRIEF DESCRIPTION OF THE DRAWINGS

FIG. 5($b$) is a graph illustrating ratios between the measured values and the calculated values illustrated in FIG. 5($a$), in terms of the absolute value Mag Z and the equivalent series resistance ESR.

FIG. 6($b$) is a graph illustrating a comparison between the calculated value obtained for the equivalent circuit model illustrated in FIG. 3 as a whole and a calculated value obtained for only the main resonant circuit, in terms of the equivalent series resistance ESR.

FIG. 7($b$) is a graph illustrating a comparison between the calculated value obtained for the equivalent circuit model illustrated in FIG. 3 as a whole and calculated values obtained for the parallel circuits of the capacitive circuit, in terms of the equivalent series resistance ESR.

FIG. 8($b$) is a graph illustrating a comparison between the calculated value obtained for the equivalent circuit model illustrated in FIG. 3 as a whole and calculated values obtained for the parallel circuits of the first secondary resonant circuit, in terms of the equivalent series resistance ESR.

FIG. 9($b$) is a graph illustrating a comparison between the calculated value obtained for the equivalent circuit model illustrated in FIG. 3 as a whole and calculated values obtained for the parallel circuits of the inductive circuit, in terms of the equivalent series resistance ESR.

DETAILED DESCRIPTION

Hereinafter, a case in which a method for deriving an equivalent circuit model of a capacitor according to an embodiment of the present disclosure is applied to a laminated ceramic capacitor will be described.

Figure 1:
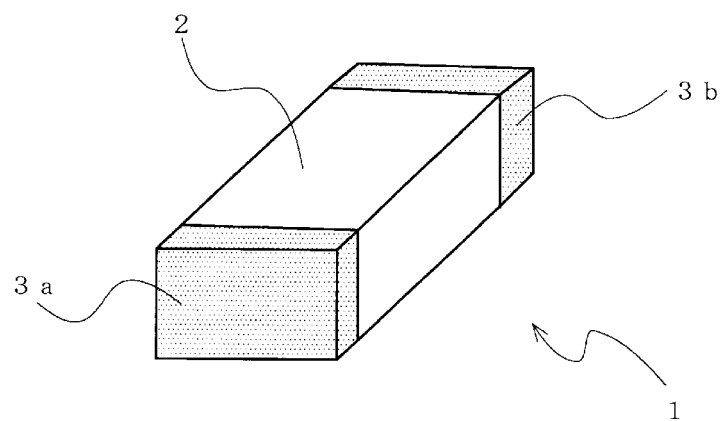
FIG. 1 is a perspective view of a laminated ceramic capacitor to which a method for deriving an equivalent circuit model of a capacitor according to an embodiment of the present disclosure is applied.

As illustrated in FIG. 1, a laminated ceramic capacitor 1 is a surface mounted chip capacitor, and includes a dielectric 2 that is formed by stacking ceramic layers and has a substantially rectangular parallelepiped shape and a pair of electrode terminals 3a and 3b disposed at respective end portions of the dielectric 2. A plurality of internal electrodes forming the capacitor are disposed facing one another inside the dielectric 2. The pair of electrode terminals 3a and 3b are connected to each of the internal electrodes that face one another. Such a laminated ceramic capacitor 1 is formed so as to include a resistance component, a capacitance component, and an inductance component.

Figure 2:
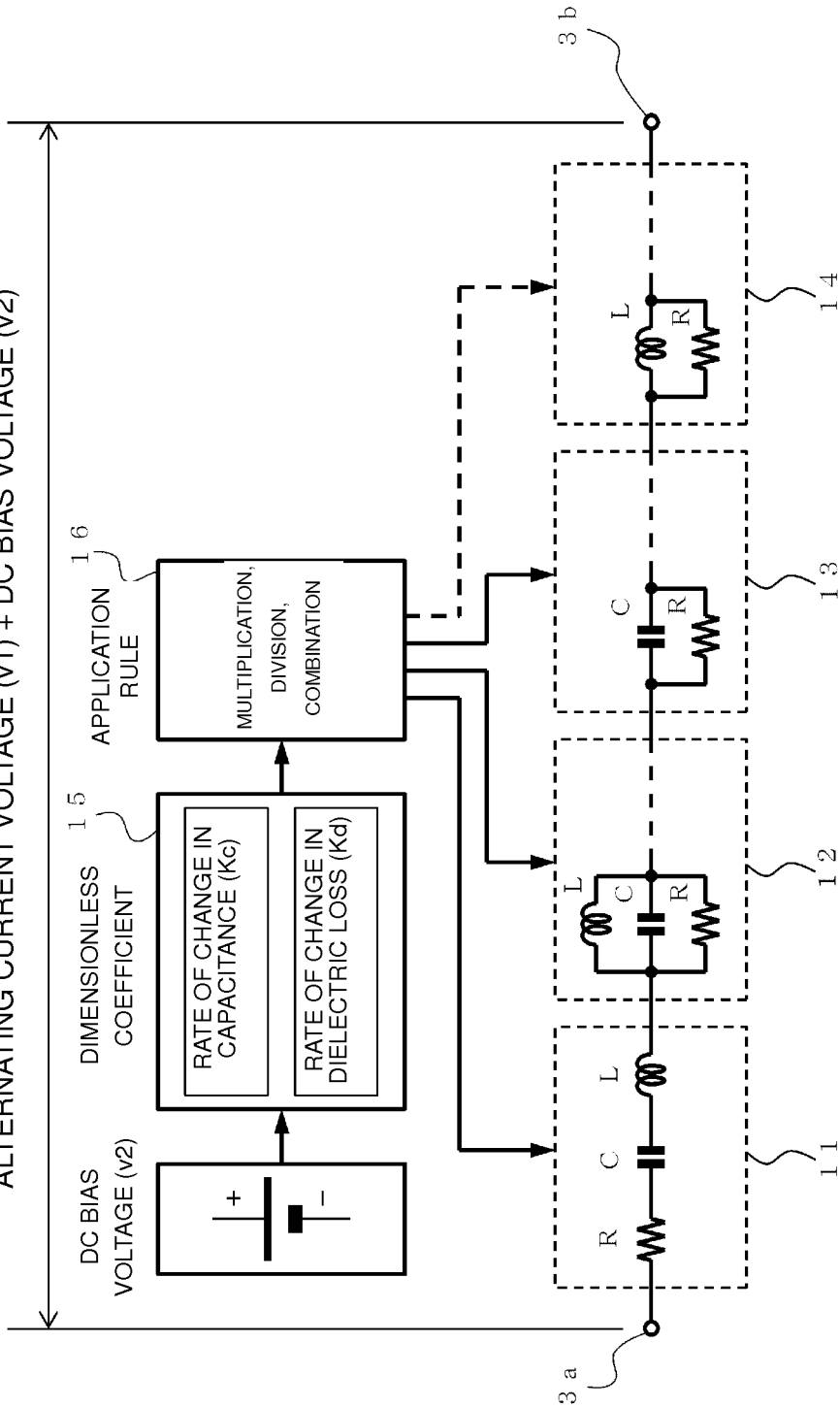
FIG. 2 is a diagram for conceptually describing a method for deriving an equivalent circuit model of a capacitor according to the present disclosure.

In the equivalent circuit model of the present embodiment, as conceptually illustrated in FIG. 2, the laminated ceramic capacitor 1 is formed by a resistive element R, a capacitive element C, and an inductive element L, and includes a main resonant circuit 11, an secondary resonant circuit 12, a capacitive circuit 13, and an inductive circuit 14 that are connected in series. The main resonant circuit 11 is formed by connecting a resistive element R, a capacitive element C, and an inductive element L in series; the secondary resonant circuit 12 is formed by connecting a resistive element R, a capacitive element C, and an inductive element L in parallel; the capacitive circuit 13 is formed by connecting a resistive element R and a capacitive element C in parallel; and the inductive circuit 14 is formed by connecting a resistive element R and an inductive element L in parallel.

In such a laminated ceramic capacitor 1, a DC bias voltage v2 is superimposed on an alternating current voltage v1, and the resulting voltage is applied across the electrode terminals 3a and 3b. In the method for deriving the equivalent circuit model of the capacitor according to the present disclosure, a rate of change in a characteristic value of an element, namely, a resistive element R, a capacitive element C, or an inductive element L, that changes as the DC bias voltage v2 is applied to the capacitor 1 is expressed as a dimensionless coefficient 15 on the basis of a rate of change in the characteristics of the capacitor 1 attributable to the material of the dielectric 2 in the capacitor 1. Then, in accordance with an application rule 16, the characteristic value of the aforementioned element forming the main resonant circuit 11, the secondary resonant circuit 12, the capacitive circuit 13, or the inductive circuit 14 is corrected to a value in accordance with the DC bias voltage v2 applied to the capacitor 1.

In the present embodiment, the dimensionless coefficient 15 is expressed for a capacitive element C or a resistive element R, of which the characteristic value changes in response to the DC bias voltage v2 being applied to the capacitor 1, on the basis of one or both of a rate of change in the capacitance Kc or a rate of change in the dielectric loss Kd of the capacitor 1, which is measured by applying the DC bias voltage v2 to the capacitor 1. The application rule 16 is defined as a rule in which the characteristic value of the aforementioned element, of which the characteristic value changes in response to the DC bias voltage v2 being applied to the capacitor 1, held while the DC bias voltage v2 is not applied is multiplied by the dimensionless coefficient 15. The characteristic value is corrected by multiplying the capacitance value of the capacitive element C, of which the capacitance value changes in accordance with the DC bias voltage v2, held while a direct current voltage is not applied and the resistance value of the resistive element R, of which the resistance value changes in accordance with the DC bias voltage v2, held while a direct current voltage is not applied by the dimensionless coefficient 15 in accordance with the application rule 16. This multiplication by the dimensionless coefficient 15 according to the application rule 16 is implemented by multiplying or dividing one of or a combination of both of the rate of change in the capacitance Kc and the rate of change in the dielectric loss Kd by the dimensionless coefficient 15, which will be described later.

Figure 3:
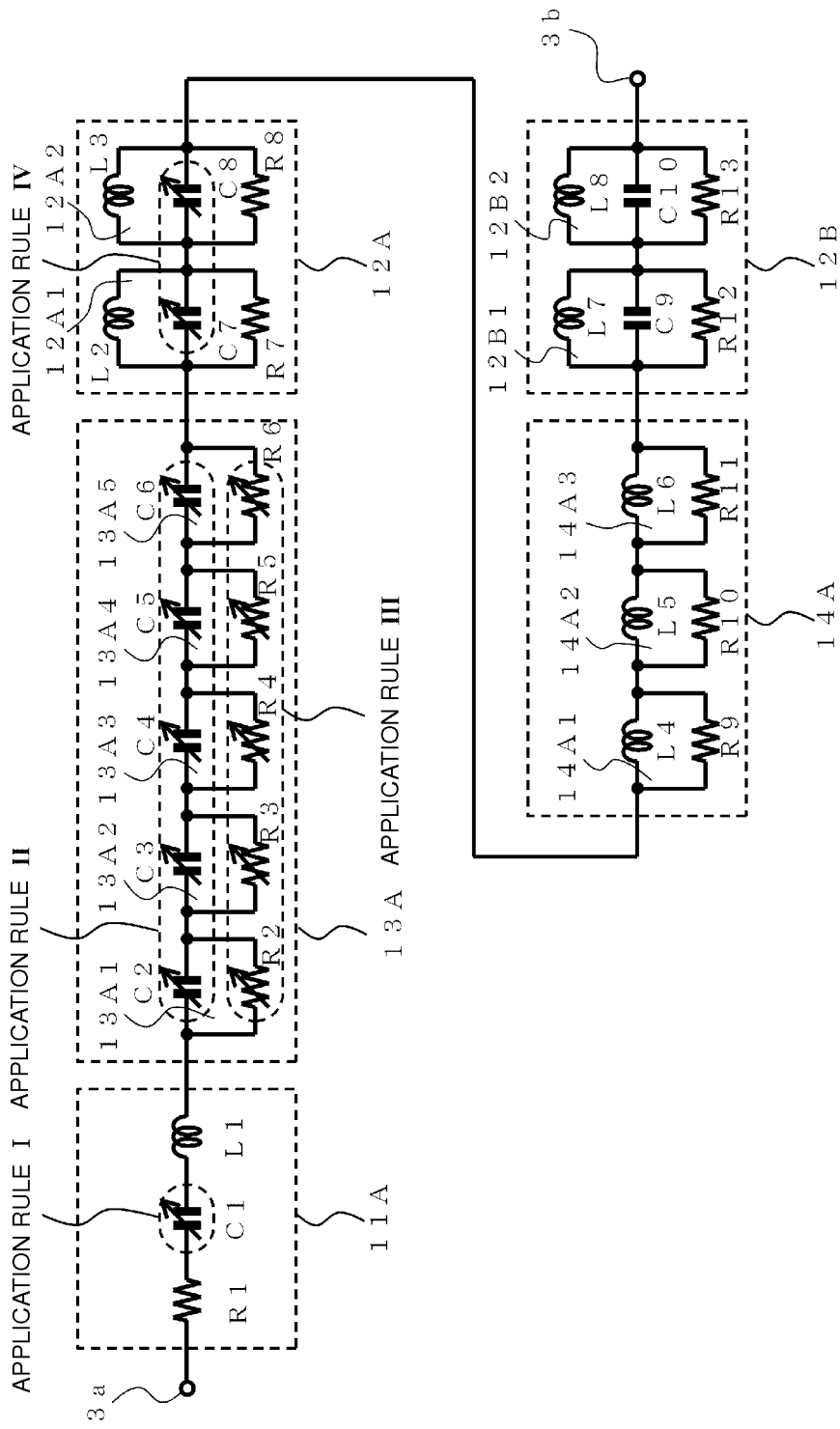
FIG. 3 is a circuit diagram illustrating a specific example of an equivalent circuit model of a capacitor according to an embodiment of the present disclosure.

FIG. 3 is a circuit diagram illustrating a specific example of the equivalent circuit model of the capacitor 1. In this example, a main resonant circuit 11A, a capacitive circuit 13A, a first secondary resonant circuit 12A, an inductive circuit 14A, and a second secondary resonant circuit 12B are connected in series to form an equivalent circuit model.

The main resonant circuit 11A is formed by a resistive element R1, a capacitive element C1, and an inductive element L1 that are connected in series. The resistance value of the resistive element R1 is $2.46 \times 10^0$ mΩ; the capacitance value of the capacitive element C1 is $8.14 \times 10^0$ μF; and the inductance of the inductive element L1 is $1.17 \times 10^2$ pH. The change in the characteristics of the resistive element R1 and the inductive element L1 of the main resonant circuit 11A resulting as the DC bias voltage v2 is applied is attributable to the metal material of the internal electrodes and the electrode terminals 3a and 3b of the capacitor 1 or to the structure or the like of the capacitor 1 and is not attributable to the material of the dielectric 2. Meanwhile, the change in the characteristics of the capacitive element C1 resulting as the DC bias voltage v2 is applied is attributable to the material of the dielectric 2. Therefore, in the main resonant circuit 11A, the characteristics of the capacitive element C1 need to be corrected in accordance with the applied voltage of the DC bias voltage v2. As the application rule 16 in the aforementioned correction, an application rule I is employed in which the capacitance value of the capacitive element C1 is multiplied by the rate of change in the capacitance Kc. In this case, the dimensionless coefficient 15 is set to the rate of change in the capacitance Kc.

The capacitive circuit 13A is formed by five parallel circuits 13A1, 13A2, 13A3, 13A4, and 13A5 that are connected in series, and the parallel circuits 13A1, 13A2, 13A3, 13A4, and 13A5 are formed by respective resistive elements R2, R3, R4, R5, and R6 and respective capacitive elements C2, C3, C4, C5, and C6. The resistance values of the resistive elements R2, R3, R4, R5, and R6 are, respectively, $5.81 \times 10^3$, $5.58 \times 10^2$, $6.43 \times 10^1$, $7.07 \times 10^0$, and $1.74 \times 10^0$ mΩ; and the capacitance values of the capacitive elements C2, C3, C4, C5, and C6 are, respectively, $5.50 \times 10^2$, $7.16 \times 10^2$, $8.86 \times 10^2$, $1.40 \times 10^2$, and $1.25 \times 10^3$ μF. The characteristics of each of the resistive elements R2 to R6 and the capacitive elements C2 to C6 forming the capacitive circuit 13A change as the DC bias voltage v2 is applied, and such a change is attributable to the material of the dielectric 2. Therefore, in the capacitive circuit 13A, the characteristics of all of the elements, namely, the resistive elements R2 to R6 and the capacitive elements C2 to C6 need to be corrected in accordance with the applied voltage of the DC bias voltage v2.

As the application rule 16 for the dimensionless coefficient 15 in the correction of the capacitive elements C2 to C6, an application rule II is employed in which the capacitance values of the capacitive elements C2 to C6 are multiplied by the rate of change in the capacitance Kc and the results are divided by the rate of change in the dielectric loss Kd. In this case, the dimensionless coefficient 15 is set to a value obtained by dividing the rate of change in the capacitance Kc by the rate of change in the dielectric loss Kd. In addition, as the application rule 16 for the dimensionless coefficient 15 in the correction of the resistive elements R2 to R6, an application rule III is employed in which the resistance values of the resistive elements R2 to R6 are multiplied by the rate of change in the dielectric loss Kd and the results are divided by the rate of change in the capacitance Kc. In this case, the dimensionless coefficient 15 is set to a value obtained by dividing the rate of change in the dielectric loss Kd by the rate of change in the capacitance Kc.

The first secondary resonant circuit 12A is formed by parallel circuits 12A1 and 12A2 that are connected in series. The parallel circuit 12A1 is formed by a resistive element R7, a capacitive element C7, and an inductive element L2; and the parallel circuit 12A2 is formed by a resistive element R8, a capacitive element C8, and an inductive element L3. The resistance values of the resistive elements R7 and R8 are, respectively, $1.63 \times 10^0$ and $2.95 \times 10^0$ mΩ; the capacitance values of the capacitive elements C7 and C8 are, respectively, $9.36 \times 10^1$ and $2.42 \times 10^1$ μF; and the inductances of the inductive elements L2 and L3 are, respectively, $2.01 \times 10^1$ and $4.60 \times 10^1$ pH. Among the aforementioned elements in the first secondary resonant circuit 12A, the capacitive elements C7 and C8 are elements of which the characteristics change as the DC bias voltage v2 is applied, and such a change is attributable to the material of the dielectric 2. Therefore, in the first secondary resonant circuit 12A, the characteristics of the capacitive elements C7 and C8 need to be corrected in accordance with the applied voltage of the DC bias voltage v2. As the application rule 16 for the dimensionless coefficient 15 in the aforementioned correction, an application rule IV is employed in which the capacitance values of the capacitive elements C7 and C8 are multiplied by the rate of change in the capacitance Kc. In this case, the dimensionless coefficient 15 is set to the rate of change in the capacitance Kc.

The inductive circuit 14A is formed by three parallel circuits 14A1, 14A2, and 14A3 that are connected in series, and the parallel circuits 14A1, 14A2, and 14A3 are formed by respective resistive elements R9, R10, and R11 and respective inductive elements L4, L5, and L6. The resistance values of the resistive elements R9, R10, and R11 are, respectively, $1.50 \times 10^1$, $3.20 \times 10^1$, and $9.73 \times 10^1$ mΩ; and the inductances of the inductive elements L4, L5, and L6 are, respectively, $3.66 \times 10^2$, $6.04 \times 10^1$, and $2.32 \times 10^1$ pH. The change in the characteristics of each of the resistive elements R9 to R11 and the inductive elements L4 to L6 forming the inductive circuit 14A resulting as the DC bias voltage v2 is applied is not attributable to the material of the dielectric 2. Therefore, in the inductive circuit 14A, the characteristics do not need to be corrected in accordance with the applied voltage of the DC bias voltage v2. However, depending on the material of the constituent elements of the capacitor 1, there is a case in which the characteristics of the inductive circuit 14A change as the DC bias voltage v2 is applied. In that case, as the application rule 16, an application rule that is appropriate for compensating for the change in the characteristics of the inductive circuit 14A resulting as the DC bias voltage v2 is applied is employed.

The second secondary resonant circuit 12B is formed by parallel circuits 12B1 and 12B2 that are connected in series. The parallel circuit 12B1 is formed by a resistive element R12, a capacitive element C9, and an inductive element L7; and the parallel circuit 12B2 is formed by a resistive element R13, a capacitive element C10, and an inductive element L8. The resistance values of the resistive elements R12 and R13 are, respectively, $4.77 \times 10^3$ and $1.00 \times 10^8$ mΩ; the capacitance values of the capacitive elements C9 and C10 are, respectively, $1.01 \times 10^{-5}$ and $4.73 \times 10^{-6}$ µF; and the inductances of the inductive elements L7 and L8 are, respectively, $4.24 \times 10^1$ and $5.25 \times 10^1$ pH. The change in the characteristics of each of the aforementioned elements forming the second secondary resonant circuit 12B resulting as the DC bias voltage v2 is applied is not attributable to the material of the dielectric 2. Therefore, the characteristics do not need to be corrected in accordance with the applied voltage of the DC bias voltage v2 in the second secondary resonant circuit 12B, either.

Figure 4:
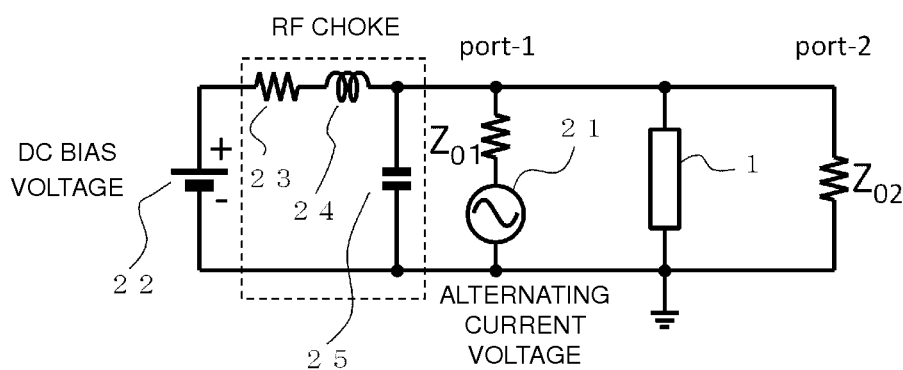
FIG. 4 is a circuit diagram of a measurement circuit for measuring a change in the characteristics of the capacitor arising as a DC bias voltage is applied to the laminated ceramic capacitor illustrated in FIG. 1.

FIG. 4 is a circuit diagram of a measurement circuit for measuring the change in the characteristics of the capacitor 1 resulting as the DC bias voltage v2 is applied to the laminated ceramic capacitor 1.

A series circuit formed by a first resistor $Z_{01}$ and an alternating current voltage source 21 is connected in parallel to the laminated ceramic capacitor 1, which is to be measured, and an alternating current voltage v1 of 0.01 Vrms is applied to the laminated ceramic capacitor 1 by the alternating current voltage source 21. In addition, the DC bias voltage v2 is superimposed on the alternating current voltage v1 by a direct current voltage source 22, and the resulting voltage is applied to the capacitor 1. A resistor 23, a coil 24, and a capacitor 25 form an RF choke circuit, which prevents a high frequency from leaking toward the direct current voltage source 22. Furthermore, a second resistor $Z_{02}$ is connected in parallel to the capacitor 1. The measurement is carried out by connecting a network analyzer between port-1 at one end of the first resistor $Z_{01}$ and port-2 at one end of the second resistor $Z_{02}$, and by applying the DC bias voltage v2 across the electrode terminals 3a and 3b of the capacitor 1 for 60 seconds under a measurement temperature of 25±3° C.

Figure 5A:
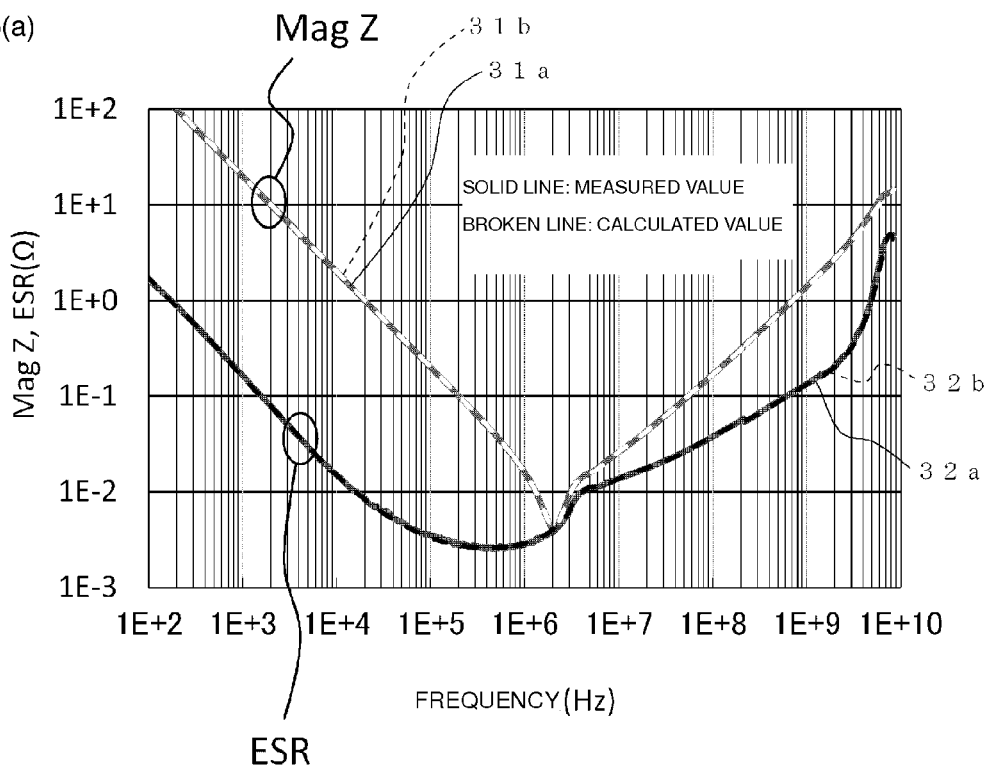
FIG. 5($a$) is a graph illustrating a comparison between measured values and calculated values obtained by using the equivalent circuit model illustrated in FIG. 3, in terms of an equivalent series resistance ESR and an absolute value Mag Z of a complex impedance Z of the capacitor held while a DC bias voltage is not applied.

FIG. 5(a) is a graph illustrating a comparison between calculated values obtained by using the equivalent circuit model illustrated in FIG. 3 and measured values obtained through the measurement circuit illustrated in FIG. 4, in terms of an equivalent series resistance ESR and an absolute value Mag Z of a complex impedance Z of the capacitor 1 held while the DC bias voltage v2 is not applied (v2=0 V).

The horizontal axis of the graph indicates the frequency Hz, and the vertical axis indicates each value Ω of the absolute value Mag Z and the equivalent series resistance ESR. Here, the gradations are indicated in powers of 10, and 1E+2, for example, indicates $1 \times 10^2$ (=100), in which "E" indicates the base 10 and +2 indicates the exponent. In a similar manner, 1E-3 indicates $1 \times 10^{-3}$ (=0.001). In addition, the measured value of the absolute value Mag Z is indicated by a solid characteristics line 31a, and the calculated value is indicated by a broken characteristics line 31b. Meanwhile, the measured value of the equivalent series resistance ESR is indicated by a solid characteristics line 32a, and the calculated value is indicated by a broken characteristics line 32b.

As illustrated by the stated graph, it is confirmed that the calculated values of the absolute value Mag Z of the complex impedance Z and of the equivalent series resistance ESR both fit well with the measured values over the entire band ranging from 100 Hz to 8.5 GHz.

Figure 5B:
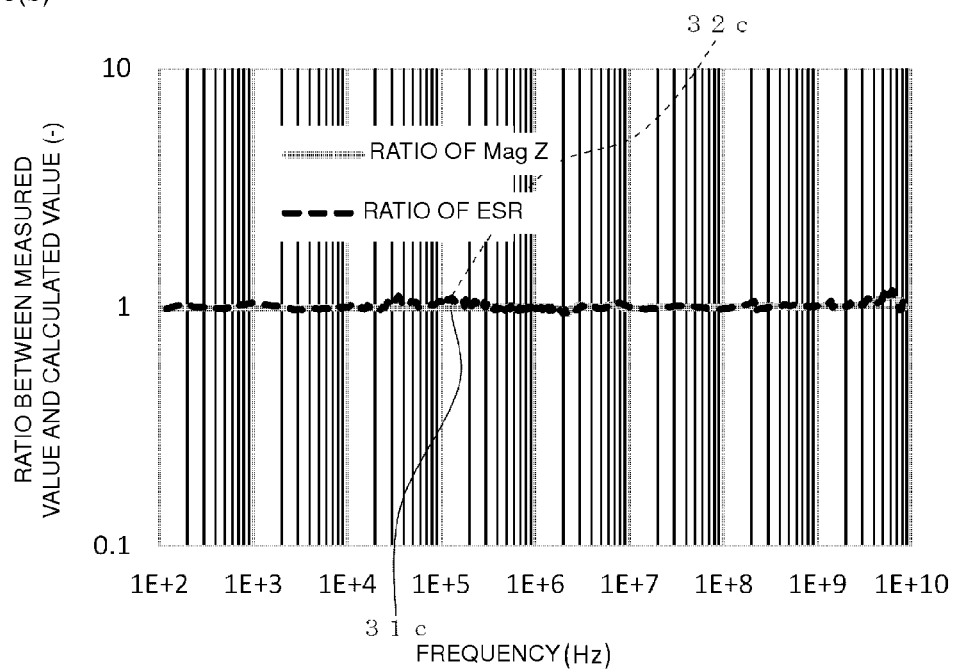

FIG. 5(b) is a graph illustrating the ratios between the aforementioned measured values and the calculated values indicated in FIG. 5(a), in terms of the absolute value Mag Z and the equivalent series resistance ESR.

The horizontal axis of the graph indicates the frequency Hz, and the vertical axis indicates the ratio between the measured values and the calculated values (=measured values/calculated values). In addition, the ratio in terms of the absolute value Mag Z is indicated by a solid characteristics line 31c, and the ratio in terms of the equivalent series resistance ESR is indicated by a broken characteristics line 32c.

As illustrated by the stated graph, it is confirmed that the ratios between the measured values and the calculated values are approximate to 1 over the entire band ranging from 100 Hz to 8.5 GHz in terms of both the absolute value Mag Z of the complex impedance Z and the equivalent series resistance ESR, and the calculated values fit well with the measured values.

Figure 6A:
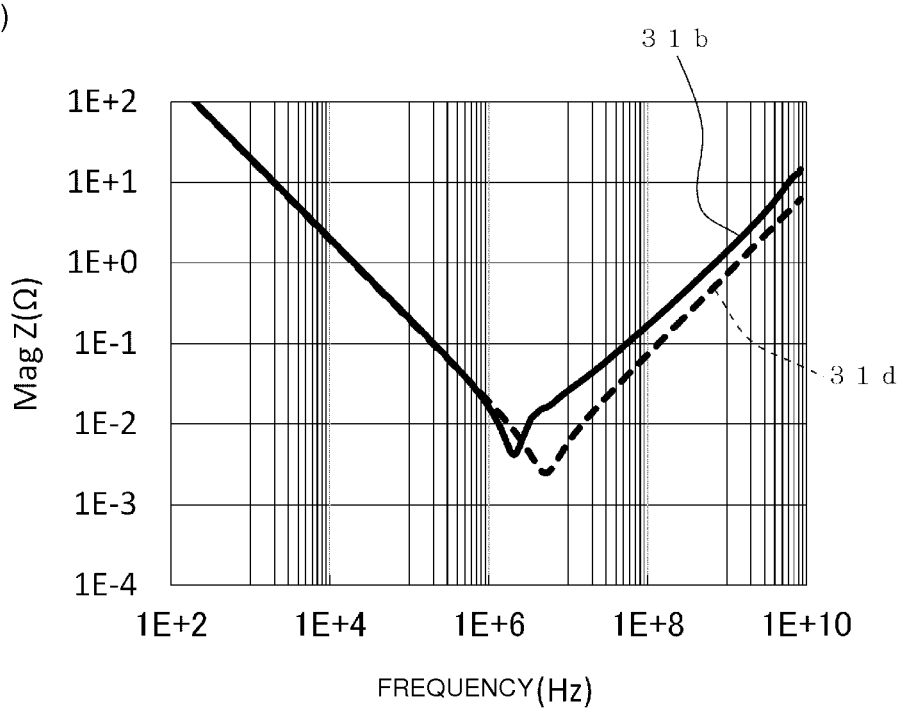
FIG. 6($a$) is a graph illustrating a comparison between the calculated value obtained for the equivalent circuit model illustrated in FIG. 3 as a whole and a calculated value obtained for only a main resonant circuit, in terms of the absolute value Mag Z of the complex impedance Z.
Figure 6B:
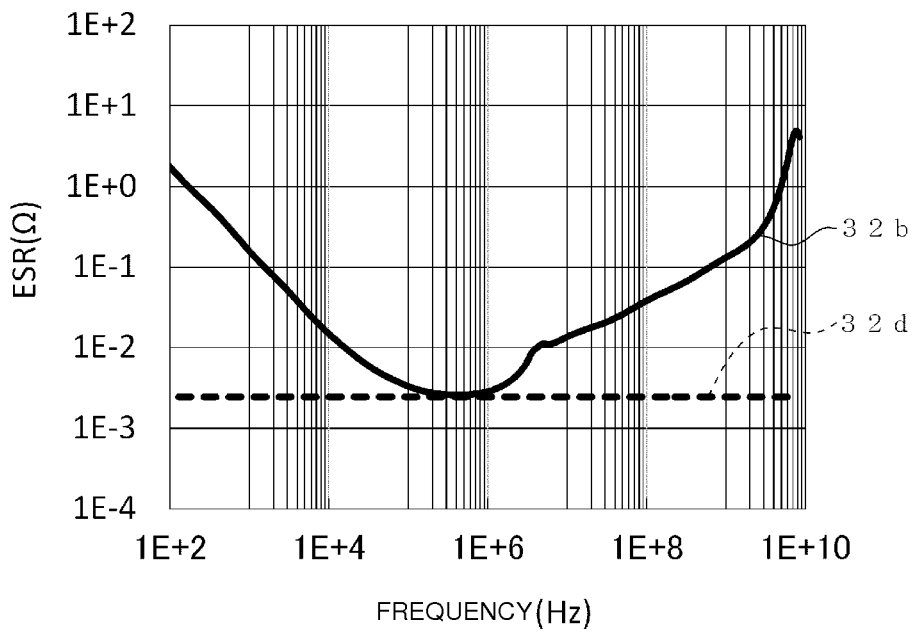

FIG. 6(a) is a graph illustrating a comparison between the calculated value obtained for the equivalent circuit model illustrated in FIG. 3 as a whole and a calculated value obtained for only the main resonant circuit 11A, in terms of the absolute value Mag Z of the complex impedance Z. Meanwhile, FIG. 6(b) is a graph illustrating a comparison between the calculated value obtained for the equivalent circuit model illustrated in FIG. 3 as a whole and a calculated value obtained for only the main resonant circuit 11A, in terms of the equivalent series resistance ESR.

The horizontal axis of each of the graphs indicates the frequency Hz, and the vertical axes indicate the value Ω of the absolute value Mag Z and the value Ω of the equivalent series resistance ESR. In addition, the calculated value obtained for the equivalent circuit model as a whole in terms of the absolute value Mag Z is indicated by the solid characteristics line 31b, and the calculated value in terms of the equivalent series resistance ESR is indicated by the solid characteristics line 32b. As in the characteristics lines 31b and 32b illustrated in FIG. 5(a), the calculated values indicated by the aforementioned characteristics lines 31b and 32b fit with the measured values. The calculated value obtained for only the main resonant circuit 11A in terms of the absolute value Mag Z is indicated by a broken characteristics line 31d, and the calculated value in terms of the equivalent series resistance ESR is indicated by a broken characteristics line 32d.

As illustrated by these graphs, it is understood that the calculated values obtained for only the main resonant circuit 11A are not approximate to the calculated values obtained for the equivalent circuit model as a whole, or in other words, are not approximate to the measured values. In particular, it is understood that the calculated value in terms of the equivalent series resistance ESR is largely offset from the measured value.

Figure 7A:
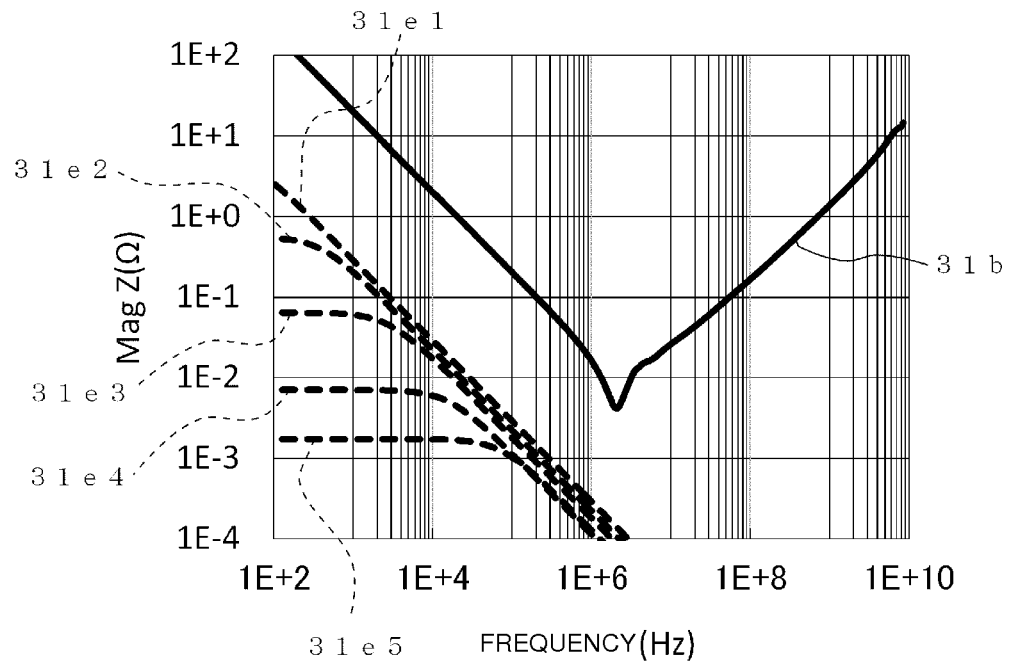
FIG. 7($a$) is a graph illustrating a comparison between the calculated value obtained for the equivalent circuit model illustrated in FIG. 3 as a whole and calculated values obtained for parallel circuits of a capacitive circuit, in terms of the absolute value Mag Z of the complex impedance Z.
Figure 7B:
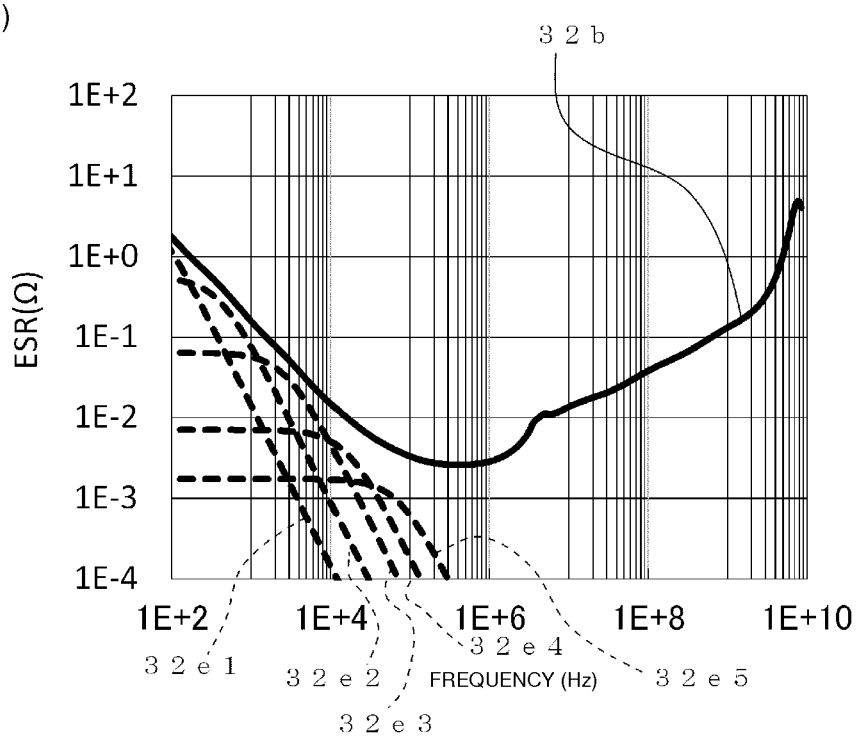

FIG. 7(a) is a graph illustrating a comparison between the calculated value obtained for the equivalent circuit model illustrated in FIG. 3 as a whole and calculated values obtained for the parallel circuits 13A1 to 13A5 of the capacitive circuit 13A, in terms of the absolute value Mag Z of the complex impedance Z. Meanwhile, FIG. 7(b) is a graph illustrating a comparison between the calculated value obtained for the equivalent circuit model illustrated in FIG. 3 as a whole and calculated values obtained for the parallel circuits 13A1 to 13A5 of the capacitive circuit 13A, in terms of the equivalent series resistance ESR.

The horizontal axis of each of the graphs also indicates the frequency Hz, and the vertical axes indicate the value Ω of the absolute value Mag Z and the value Ω of the equivalent series resistance ESR. In addition, the calculated value obtained for the equivalent circuit model as a whole, which fits with the measured value, in terms of the absolute value Mag Z is also indicated by the solid characteristics line 31b, and the calculated value in terms of the equivalent series resistance ESR is indicated by the solid characteristics line 32b. The calculated values obtained for the parallel circuits 13A1, 13A2, 13A3, 13A4, and 13A5 of the capacitive circuit 13A in terms of the absolute value Mag Z are indicated, respectively, by broken characteristics lines 31e1, 31e2, 31e3, 31e4, and 31e5, and the calculated values in terms of the equivalent series resistance ESR are indicated by broken characteristics lines 32e1, 32e2, 32e3, 32e4, and 32e5.

Through the parallel circuits 13A1 to 13A5 of the capacitive circuit 13A, the ESR characteristics in a frequency band of a capacitive region at a lower frequency side of the self resonant frequency of the capacitor 1 fit with those of the characteristics line 32b obtained for the equivalent circuit model as a whole. In other words, through the calculation for only the main resonant circuit 11A, as illustrated in FIG. 6(b), the characteristics line 32d is largely offset from the characteristics line 32b in a frequency band at a lower frequency side capacitive region. However, with the capacitive circuit 13A, the characteristics indicated by the characteristics lines 32e1 to 32e5 illustrated in FIG. 7(b) are added to the characteristics indicated by the characteristics line 32d obtained for the main resonant circuit 11A, and thus the calculated value of the ESR characteristics in a frequency band at the lower frequency side capacitive region fit with the measured value. It is to be noted that as the number of parallel circuits forming the capacitive circuit 13A increases, the characteristics of a broader band fit smoothly.

Figure 8A:
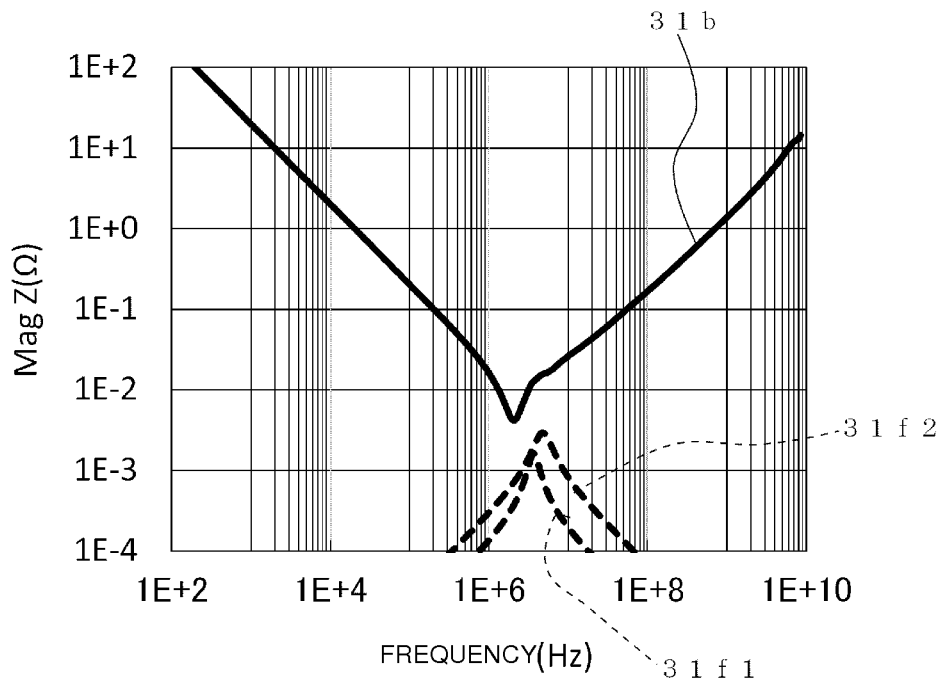
FIG. 8($a$) is a graph illustrating a comparison between the calculated value obtained for the equivalent circuit model illustrated in FIG. 3 as a whole and calculated values obtained for parallel circuits of a first secondary resonant circuit, in terms of the absolute value Mag Z of the complex impedance Z.
Figure 8B:
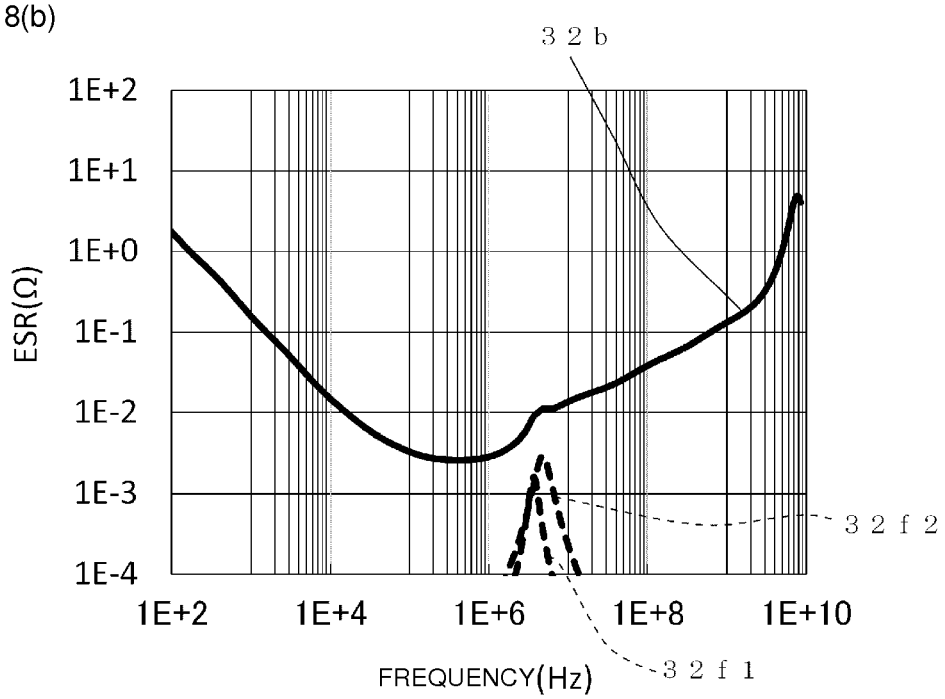

FIG. 8(a) is a graph illustrating a comparison between the calculated value obtained for the equivalent circuit model illustrated in FIG. 3 as a whole and calculated values obtained for the parallel circuits 12A1 and 12A2 of the first secondary resonant circuit 12A, in terms of the absolute value Mag Z of the complex impedance Z. Meanwhile, FIG. 8(b) is a graph illustrating a comparison between the calculated value obtained for the equivalent circuit model illustrated in FIG. 3 as a whole and calculated values obtained for the parallel circuits 12A1 and 12A2 of the first secondary resonant circuit 12A, in terms of the equivalent series resistance ESR.

The horizontal axis of each of the graphs also indicates the frequency Hz, and the vertical axes indicate the value Ω of the absolute value Mag Z and the value Ω of the equivalent series resistance ESR. In addition, the calculated value obtained for the equivalent circuit model as a whole, which fits with the measured value, in terms of the absolute value Mag Z is indicated by the solid characteristics line 31b, and the calculated value in terms of the equivalent series resistance ESR is indicated by the solid characteristics line 32b. The calculated values obtained for the parallel circuits 12A1 and 12A2 of the first secondary resonant circuit 12A in terms of the absolute value Mag Z are indicated, respectively, by broken characteristics lines 31f1 and 31f2, and the calculated values in terms of the equivalent series resistance ESR are indicated by broken characteristics lines 32f1 and 32f2.

Through the parallel circuits 12A1 and 12A2 of the first secondary resonant circuit 12A, the change in the characteristics protruding toward the upper side of the graph with a gentle curvature at a frequency around the secondary resonant frequency exceeding the self resonant frequency of the capacitor 1 fit with that of the measured value. In other words, through the calculation for only the main resonant circuit 11A, as illustrated in FIG. 6, the characteristics line 31d and the characteristics line 32d are unable to have such a change in the characteristics that protrudes toward the upper side of the graph with a gentle curvature, as in the characteristics lines 31b and 32b, at a frequency around the secondary resonant frequency exceeding the self resonant frequency. However, with the first secondary resonant circuit 12A, the characteristics indicated by the characteristics lines 31f1 and 31f2 illustrated in FIG. 8(a) and the characteristics indicated by the characteristics lines 32f1 and 32f2 illustrated in FIG. 8(b) are added to the characteristics indicated by the characteristics line 31d illustrated in FIG. 6(a) and by the characteristics line 32d illustrated in FIG. 6(b), and thus the characteristics that protrude toward the upper side of the graph with a gentle curvature around the secondary resonant frequency exceeding the self resonant frequency can fit with those of the measured values.

Figure 9A:
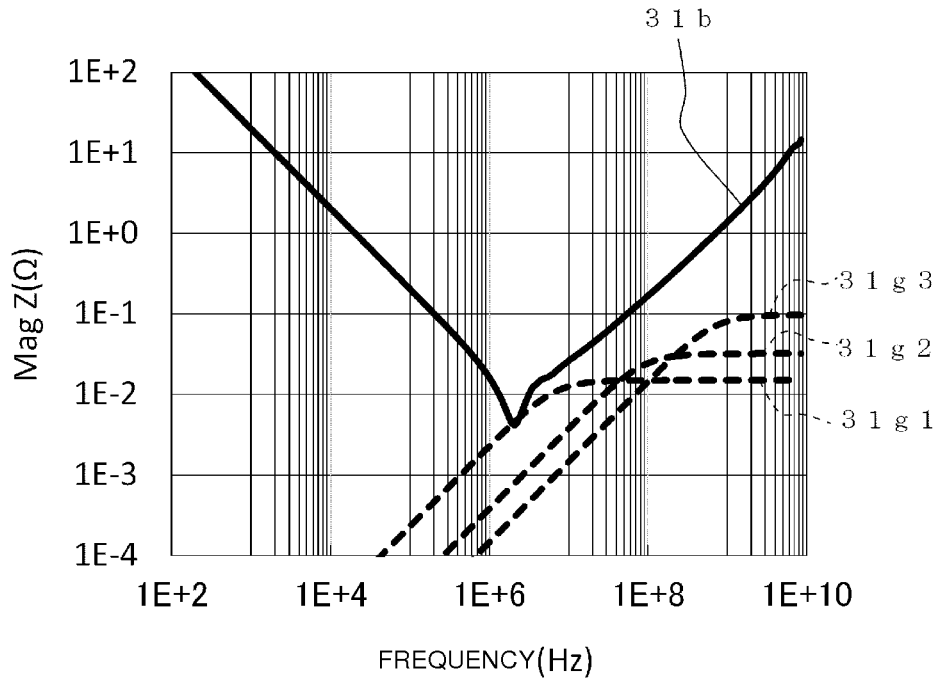
FIG. 9($a$) is a graph illustrating a comparison between the calculated value obtained for the equivalent circuit model illustrated in FIG. 3 as a whole and calculated values obtained for parallel circuits of an inductive circuit, in terms of the absolute value Mag Z of the complex impedance Z.
Figure 9B:
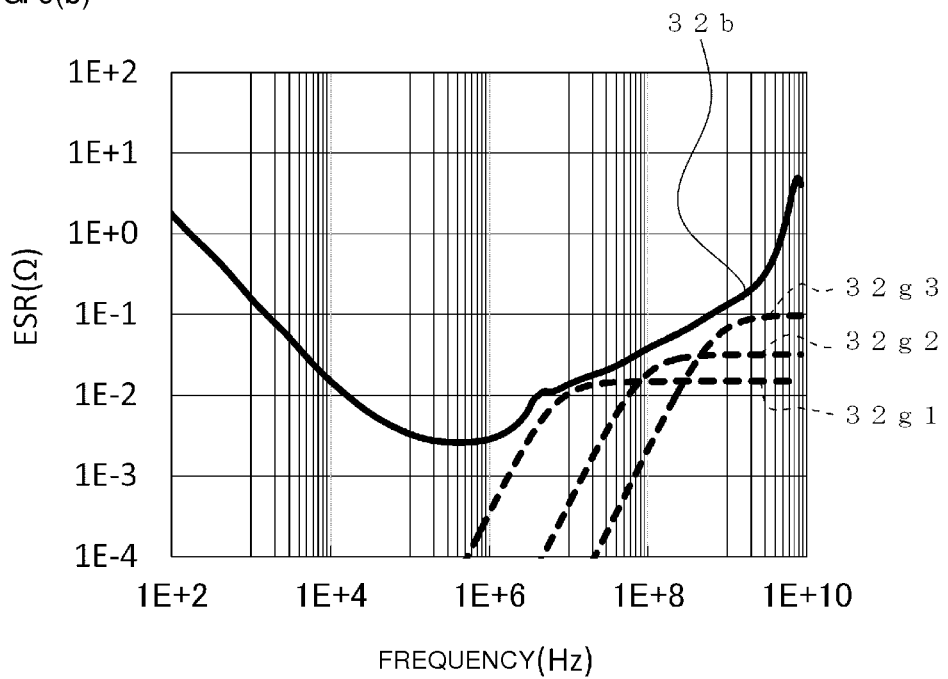

FIG. 9(a) is a graph illustrating a comparison between the calculated value obtained for the equivalent circuit model illustrated in FIG. 3 as a whole and calculated values obtained for the parallel circuits 14A1 to 14A3 of the inductive circuit 14A, in terms of the absolute value Mag Z of the complex impedance Z. Meanwhile, FIG. 9(b) is a graph illustrating a comparison between the calculated value obtained for the equivalent circuit model illustrated in FIG. 3 as a whole and calculated values obtained for the parallel circuits 14A1 to 14A3 of the inductive circuit 14A, in terms of the equivalent series resistance ESR.

The horizontal axis of each of the graphs also indicates the frequency Hz, and the vertical axes indicate the value Ω of the absolute value Mag Z and the value Ω of the equivalent series resistance ESR. In addition, the calculated value obtained for the equivalent circuit model as a whole, which fits with the measured value, in terms of the absolute value Mag Z is indicated by the solid characteristics line 31b, and the calculated value in terms of the equivalent series resistance ESR is indicated by the solid characteristics line 32b. The calculated values obtained for the parallel circuits 14A1, 14A2, and 14A3 of the inductive circuit 14A in terms of the absolute value Mag Z are indicated, respectively, by broken characteristics lines 31g1, 31g2, and 31g3, and the calculated values in terms of the equivalent series resistance ESR are indicated by broken characteristics lines 32g1, 32g2, and 32g3.

Through the parallel circuits 14A1 to 14A3 of the inductive circuit 14A, the absolute value Mag Z characteristics and the ESR characteristics in a frequency band of an inductive region at a higher frequency side of the self resonant frequency of the capacitor 1 fit with those of the characteristics line 31b and the characteristics line 32b obtained for the equivalent circuit model as a whole. In other words, with only the main resonant circuit 11A, as illustrated in FIG. 6, the characteristics line 31d and the characteristics line 32d are largely offset from the characteristics line 31b and the characteristics line 32b in a frequency band at a higher frequency side inductive region. However, with the inductive circuit 14A, the characteristics indicated by the characteristics lines 31g1 to 31g3 illustrated in FIG. 9(a) and the characteristics indicated by the characteristics lines 32g1 to 32g3 illustrated in FIG. 9(b) are added to the characteristics indicated by the characteristics line 31d and the characteristics line 32d obtained for the main resonant circuit 11A, and thus the absolute value Mag Z characteristics and the ESR characteristics in a frequency band at a higher frequency side inductive region fit with those of the measured values. It is to be noted that as the number of parallel circuits forming the inductive circuit 14A increases, the characteristics of a broader band fit smoothly.

Figure 10A:
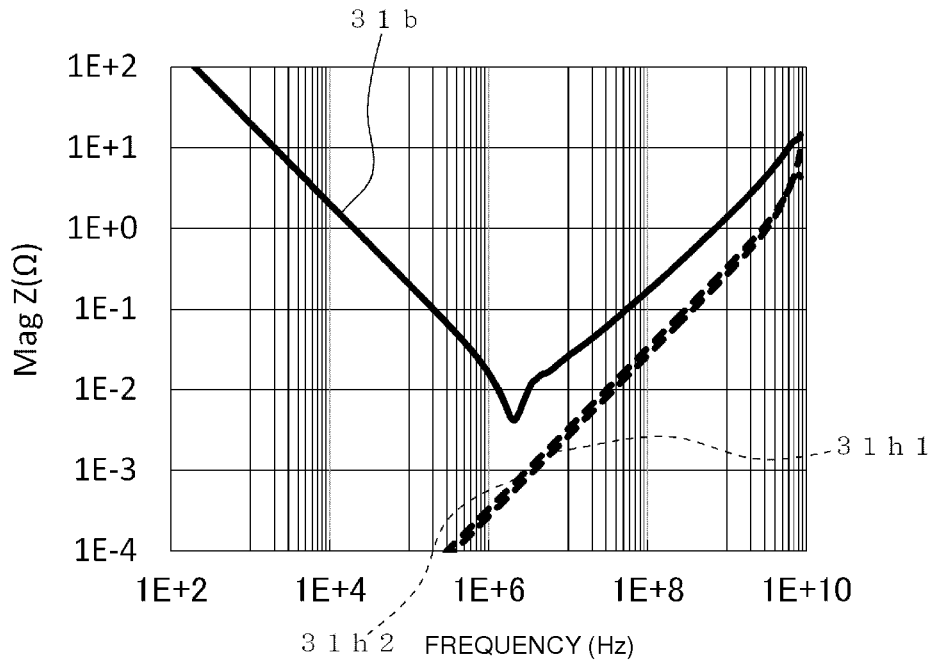
FIG. 10(a) is a graph illustrating a comparison between the calculated value obtained for the equivalent circuit model illustrated in FIG. 3 as a whole and calculated values obtained for parallel circuits of a second secondary resonant circuit, in terms of the absolute value Mag Z of the complex impedance Z.
Figure 10B:
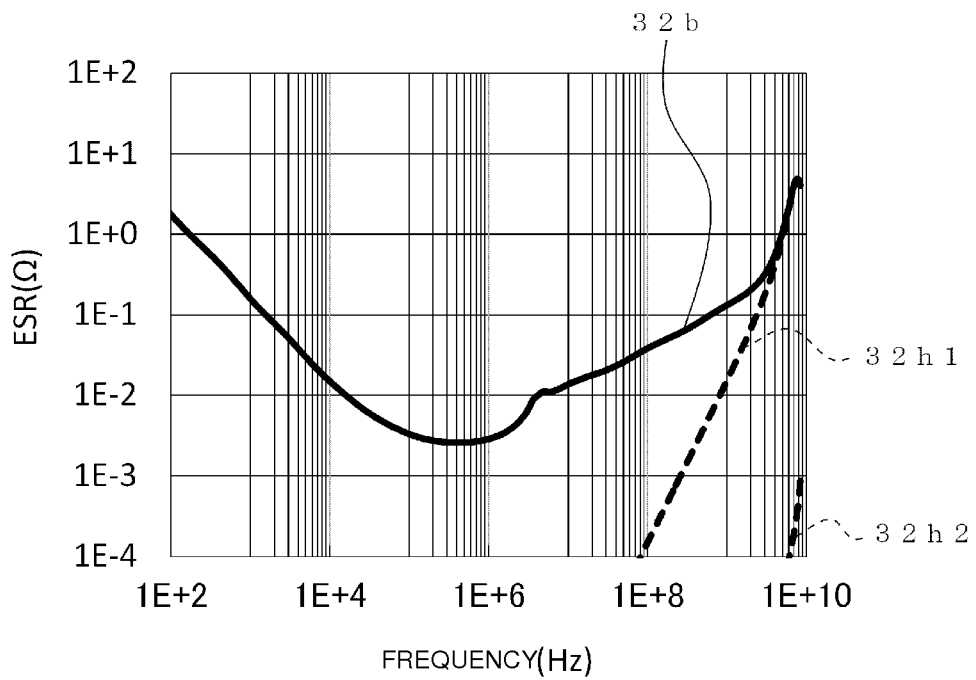
FIG. 10(b) is a graph illustrating a comparison between the calculated value obtained for the equivalent circuit model illustrated in FIG. 3 as a whole and calculated values obtained for the parallel circuits of the second secondary resonant circuit, in terms of the equivalent series resistance ESR.

FIG. 10(a) is a graph illustrating a comparison between the calculated value obtained for the equivalent circuit model illustrated in FIG. 3 as a whole and calculated values obtained for the parallel circuits 12B1 and 12B2 of the second secondary resonant circuit 12B, in terms of the absolute value Mag Z of the complex impedance Z. Meanwhile, FIG. 10(b) is a graph illustrating a comparison between the calculated value obtained for the equivalent circuit model illustrated in FIG. 3 as a whole and calculated values obtained for the parallel circuits 12B1 and 12B2 of the second secondary resonant circuit 12B, in terms of the equivalent series resistance ESR.

The horizontal axis of each of the graphs also indicates the frequency Hz, and the vertical axes indicate the value Ω of the absolute value Mag Z and the value Ω of the equivalent series resistance ESR. In addition, the calculated value obtained for the equivalent circuit model as a whole, which fits with the measured value, in terms of the absolute value Mag Z is indicated by the solid characteristics line 31b, and the calculated value in terms of the equivalent series resistance ESR is indicated by the solid characteristics line 32b. The calculated values obtained for the parallel circuits 12B1 and 12B2 of the second secondary resonant circuit 12B in terms of the absolute value Mag Z are indicated by broken characteristics lines 31h1 and 31h2, and the calculated values in terms of the equivalent series resistance ESR are indicated by broken characteristics lines 32h1 and 32h2.

Through the parallel circuits 12B1 and 12B2 of the second secondary resonant circuit 12B as well, the absolute value Mag Z characteristics and the ESR characteristics in a frequency band at a higher frequency side of the self resonant frequency of the capacitor 1 fit with those of the measured values. The characteristics line 32h1 obtained for the parallel circuit 12B1 of the second secondary resonant circuit 12B contributes to the fitting of the ESR characteristics in a higher frequency band, and the characteristics line 31h2 obtained for the parallel circuit 12B2 contributes to the fine tuning of the absolute value Mag Z characteristics in a higher frequency side frequency band.

With the equivalent circuit model, illustrated in FIG. 3, according to an example of the present embodiment, the main resonant circuit 11A, the capacitive circuit 13A, the first secondary resonant circuit 12A, the inductive circuit 14A, and the second secondary resonant circuit 12B each exhibit the characteristics described above, and thus, as the equivalent circuit as a whole, the calculated values of the equivalent series resistance ESR and the absolute value Mag Z of the complex impedance Z held while the DC bias voltage v2 is not applied and fit well with the actual measured values, as illustrated in FIG. 5(a).

In addition, with the use of the measurement circuit illustrated in FIG. 4, the DC bias voltage v2 ranging from 0 V to a rated voltage of 6.3 V was applied across the electrode terminals 3a and 3b of the capacitor 1, and the change in the characteristics of the capacitor 1 arising when each of the DC bias voltages v2 was applied was measured. As mentioned earlier, the measurement was carried out by connecting a network analyzer between port-1 and port-2 and by applying the DC bias voltage v2 for 60 seconds at a measurement frequency of 1 kHz under a measurement temperature of 25±3° C.

Through this measurement, measured values for the complex impedance Z or the absolute value Mag Z of the complex impedance Z and for the equivalent series resistance ESR of the capacitor 1 were obtained at each of the DC bias voltages v2. Then, from the measured values, an equivalent series capacitance ESC of the capacitor 1 was calculated through the following expression (1), and a dielectric loss tan δ was calculated through the following expression (2). Here, Im(Z) represents an imaginary part of the complex impedance Z, and Re(Z) represents a real part of the complex impedance Z.

Math. 1

$$ESC = -\frac{1}{\omega \text{Im}(Z)} = \frac{1}{\omega\sqrt{(Mag\ Z)^2 - (ESR)^2}} \quad (1)$$

Math. 2

$$\tan\delta = -\frac{\text{Re}(Z)}{\text{Im}(z)} = \frac{ESR}{\sqrt{(Mag\ Z)^2 - (ESR)^2}} \quad (2)$$

Table 1 below indicates the equivalent series capacitance C μF and the dielectric loss tan δ % of the capacitor 1 obtained through the calculation above, and the rate of change in the capacitance Kc—and the rate of change in the dielectric loss Kd—in terms of the characteristic values held while the DC bias voltage v2 is not applied. The rate of change in the capacitance Kc and the rate of change in the dielectric loss Kd are dimensionless quantities that do not have a dimension, and – indicates that these are dimensionless.

TABLE 1

| DC BIAS VOLTAGE (V) | CAPACITANCE C (μF) | RATE OF CHANGE Kc (—) | DIELECTRIC LOSS tanδ (%) | RATE OF CHANGE Kd (—) |
|---|---|---|---|---|
| 0 | 8.212 | 1 | 0.733 | 1 |
| 0.5 | 8.323 | 1.013 | 0.870 | 1.186 |
| 1 | 8.137 | 0.991 | 0.857 | 1.168 |
| 1.5 | 7.813 | 0.951 | 0.837 | 1.141 |
| 2 | 7.395 | 0.901 | 0.810 | 1.105 |
| 2.5 | 6.926 | 0.843 | 0.773 | 1.055 |
| 3.15 | 6.297 | 0.767 | 0.737 | 1.005 |
| 4 | 5.503 | 0.670 | 0.693 | 0.945 |
| 5 | 4.670 | 0.569 | 0.647 | 0.882 |
| 6.3 | 3.781 | 0.460 | 0.603 | 0.823 |

Figure 11A:
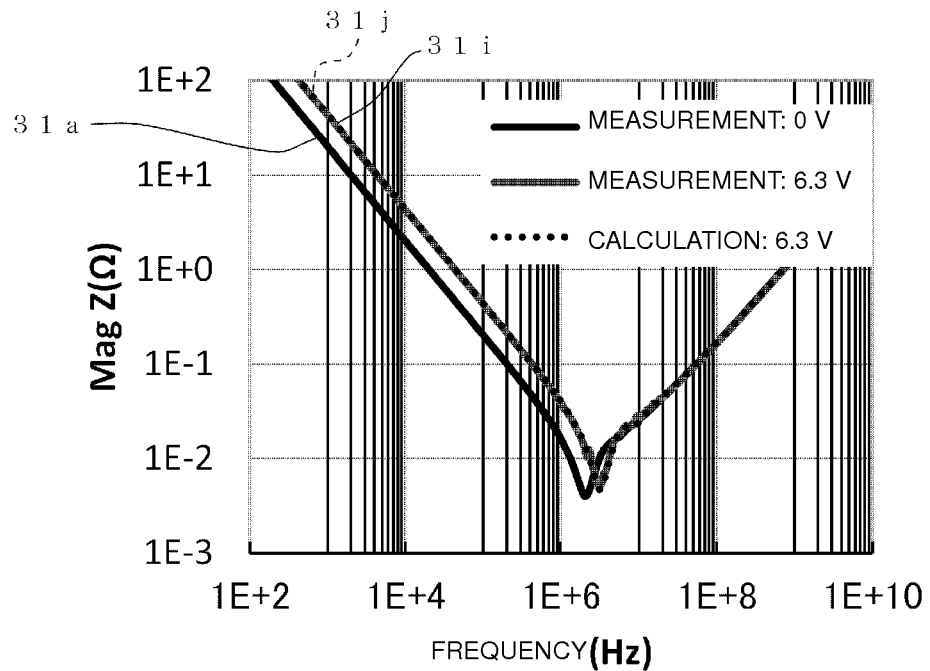
FIG. 11(a) is a graph illustrating a comparison between a measured value and a calculated value obtained by using the equivalent circuit model illustrated in FIG. 3, in terms of the absolute value Mag Z of the complex impedance Z of the capacitor held when the DC bias voltage is applied at a rated voltage.

FIG. 11(a) is a graph illustrating a comparison between a measured value and a calculated value obtained by using the equivalent circuit model illustrated in FIG. 3, in terms of the absolute value Mag Z of the complex impedance Z of the capacitor 1 held when the DC bias voltage v2 is applied at the rated voltage of 6.3 V. The horizontal axis of the graph indicates the frequency Hz, and the vertical axis indicates the value Ω of the absolute value Mag Z. The measured value of the absolute value Mag Z obtained when the DC bias voltage v2 is 0 V is indicated by the solid characteristics line 31a, and the measured value of the absolute value Mag Z obtained when the DC bias voltage v2 is 6.3 V is indicated by a solid characteristics line 31i. Meanwhile, the calculated value of the absolute value Mag Z obtained when the DC bias voltage v2 is 6.3 V is indicated by a broken characteristics line 31j.

Figure 11B:
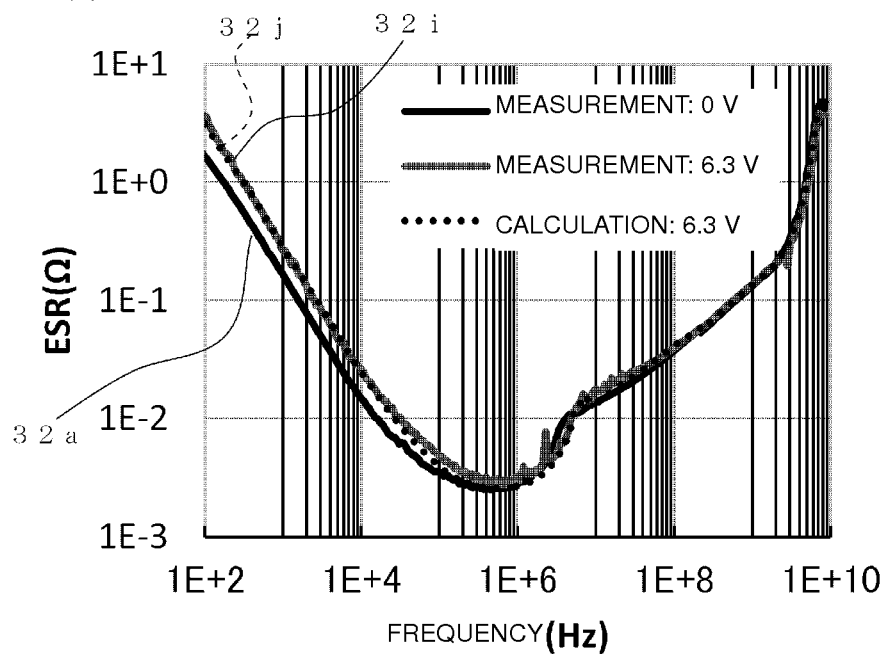
FIG. 11(b) is a graph illustrating a comparison between a measured value and a calculated value obtained by using the equivalent circuit model illustrated in FIG. 3, in terms of the equivalent series resistance ESR of the capacitor held when the DC bias voltage is applied at the rated voltage.

FIG. 11(b) is a graph illustrating a comparison between a measured value and a calculated value obtained by using the equivalent circuit model illustrated in FIG. 3, in terms of the equivalent series resistance ESR of the capacitor 1 held when the DC bias voltage v2 is applied at the rated voltage of 6.3 V. The horizontal axis of the graph indicates the frequency Hz, and the vertical axis indicates the value Ω of the equivalent series resistance ESR. The measured value of the equivalent series resistance ESR obtained when the DC bias voltage v2 is 0 V is indicated by the solid characteristics line 32a, and the measured value of the equivalent series resistance ESR obtained when the DC bias voltage v2 is 6.3 V is indicated by a solid characteristics line 32i. Meanwhile, the calculated value of the equivalent series resistance ESR obtained when the DC bias voltage v2 is 6.3 V is indicated by a broken characteristics line 32j.

The calculated values indicated in the graphs have been obtained with the use of the deriving method according to the present embodiment, or by applying the dimensionless coefficient 15 obtained from the rate of change in the capacitance Kc and the rate of change in the dielectric loss Kd indicated in Table 1 in accordance with the application rule 16 described with reference to FIGS. 2 and 3. As indicated in the graphs, the calculated values, indicated by the characteristics lines 31*j* and 32*j*, of the absolute value Mag Z of the complex impedance Z and the equivalent series resistance ESR obtained when the DC bias voltage v2 is 6.3 V both fit well with the measured values indicated by the characteristics lines 31*i* and 32*i* obtained when the DC bias voltage v2 is 6.3 V over the entire band ranging from 100 Hz to 8.5 GHz.

Here, in a case in which the DC bias voltage v2 is superimposed and applied to the capacitor 1, a waveform that looks like noise is observed in the characteristics lines 31*j* and 32*j* for the measured values in a frequency band of a several MHz ($=10^{+6}$ Hz). These are, however, caused by structural resonance resulting from the piezoelectricity of the dielectric 2 forming the capacitor 1 and thus were ignored in the method for deriving the equivalent circuit model according to the present embodiment.

Figure 12A:
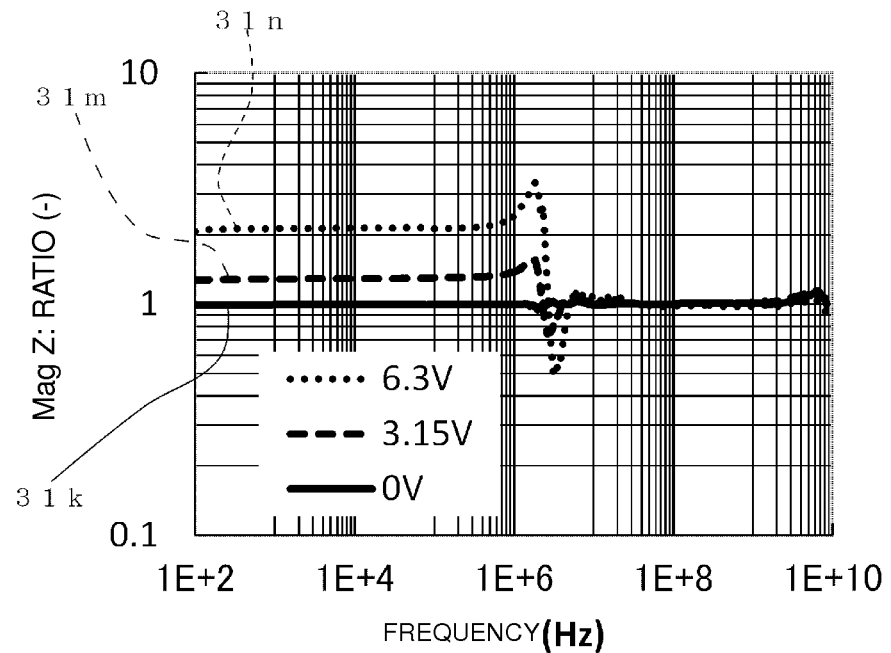
FIG. 12(a) is a graph illustrating a ratio between a measured value and a calculated value obtained without employing the deriving method according to the present embodiment, in terms of the absolute value Mag Z of the complex impedance Z of the capacitor held when the DC bias voltage is applied at three levels of 0 V, 3.15 V, and 6.3 V.
Figure 12B:
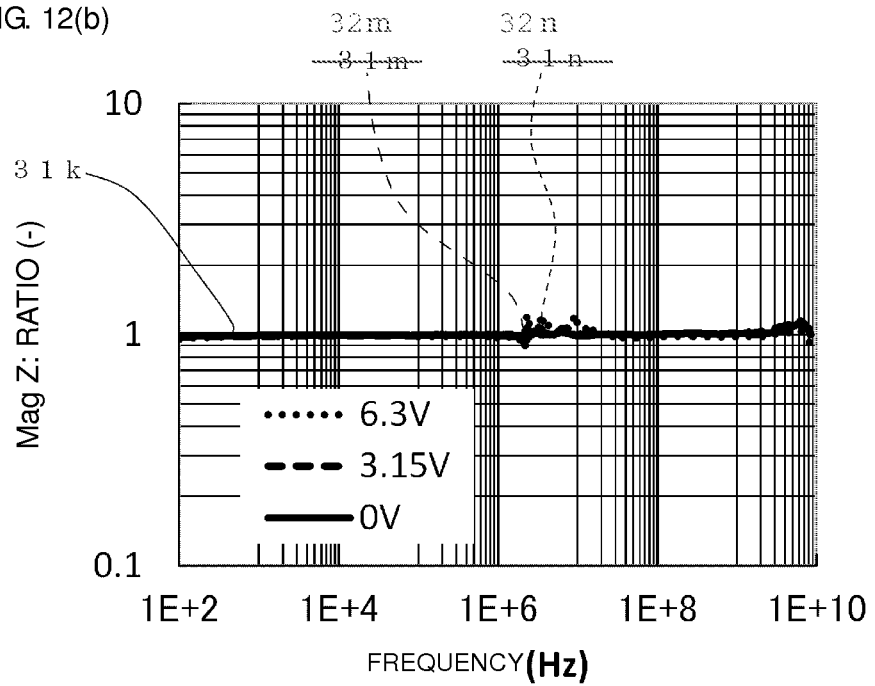
FIG. 12(b) is a graph illustrating a ratio between the measured value and a calculated value obtained by employing the deriving method according to the present embodiment, in terms of the absolute value Mag Z of the complex impedance Z of the capacitor held when the DC bias voltage is applied at three levels of 0 V, 3.15 V, and 6.3 V.

FIG. 12(*a*) is a graph illustrating a ratio between a measured value obtained by using the measurement circuit illustrated in FIG. 4 and a calculated value obtained without employing the dimensionless coefficient 15 in accordance with the application rule 16, in terms of the absolute value Mag Z of the complex impedance Z of the capacitor 1 held when the DC bias voltage v2 is applied at three levels of 0 V, 3.15 V, and 6.3 V. Meanwhile, FIG. 12(*b*) is a graph illustrating a ratio between the measured value obtained by using the measurement circuit illustrated in FIG. 4 and a calculated value obtained, through the deriving method of the present embodiment, by employing the dimensionless coefficient 15 in accordance with the application rule 16, in terms of the absolute value Mag Z of the complex impedance Z of the capacitor 1 held when the DC bias voltage v2 is applied at three levels of 0 V, 3.15 V, and 6.3 V.

The horizontal axis of each of the graphs indicates the frequency Hz, and the vertical axis indicates the ratio between the measured value and the calculated value (=measured value/calculated value). In addition, the ratio obtained when the DC bias voltage v2 is 0 V is indicated by a solid characteristics line 31*k*; the ratio obtained when the DC bias voltage v2 is 3.15 V is indicated by a dashed characteristics line 31*m*; and the ratio obtained when the DC bias voltage v2 is 6.3 V is indicated by a dotted characteristics line 31*n*.

With regard to the ratio between the measured value and the calculated value, according to the graph indicating the ratio between the measured value and the calculated value obtained without employing the dimensionless coefficient 15 as illustrated in FIG. 12(*a*), the characteristics lines 31*m* and 31*n* obtained when the DC bias voltage v2 is applied are not approximate to 1 in a lower frequency side. In the meantime, according to the graph indicating the ratio between the measured value and the calculated value obtained by employing the dimensionless coefficient 15 as illustrated in FIG. 12(*b*), the characteristics lines 31*m* and 31*n* obtained when the DC bias voltage v2 is applied could be made approximate to 1 throughout the entire frequency band.

Figure 13A:
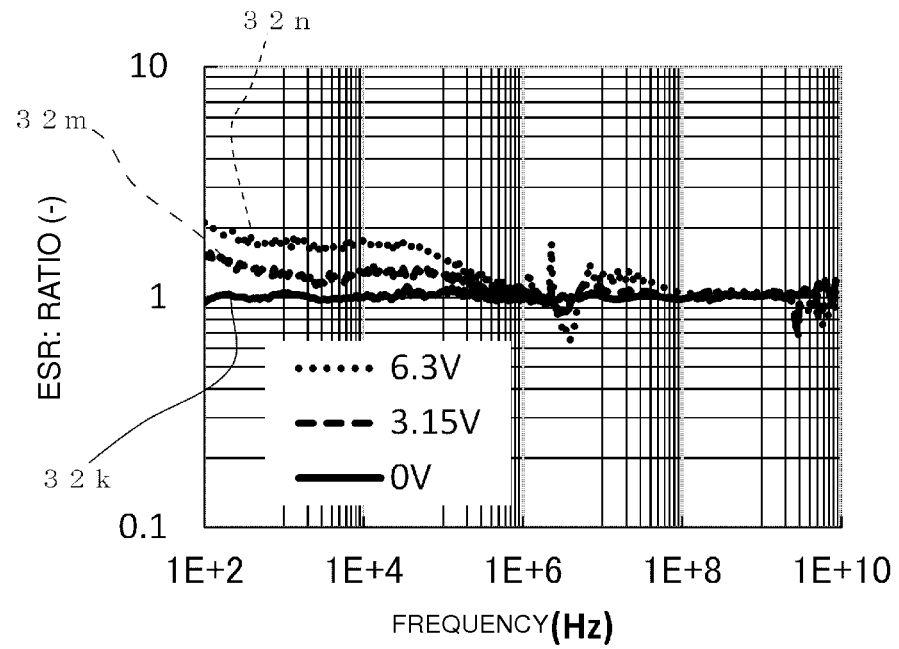
FIG. 13(a) is a graph illustrating a ratio between a measured value and a calculated value obtained without employing the deriving method according to the present embodiment, in terms of the equivalent series resistance ESR of the capacitor held when a DC bias voltage is applied at three levels of 0 V, 3.15 V, and 6.3 V.
Figure 13B:
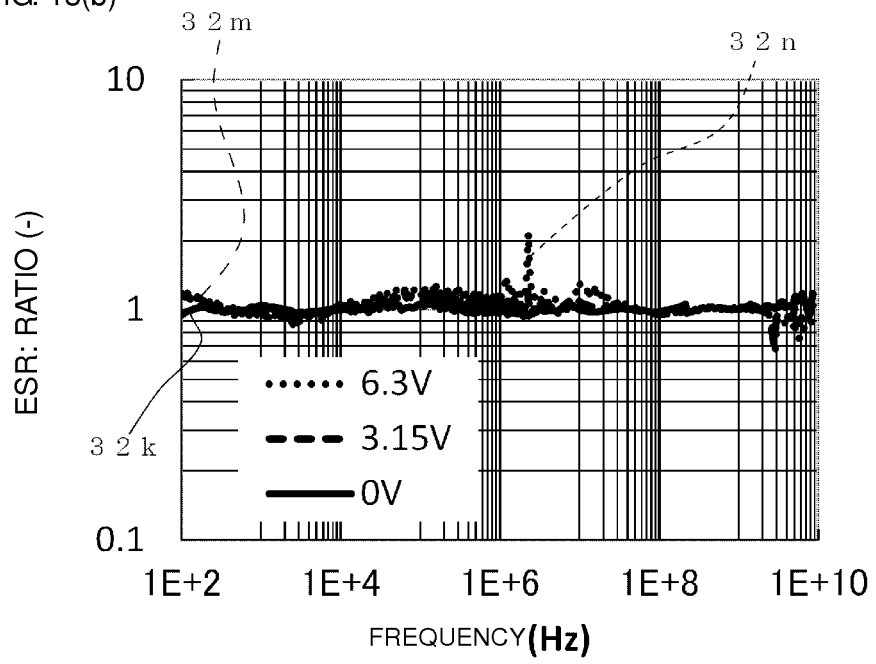
FIG. 13(b) is a graph illustrating a ratio between the measured value and a calculated value obtained by employing the deriving method according to the present embodiment, in terms of the equivalent series resistance ESR of the capacitor held when the DC bias voltage is applied at three levels of 0 V, 3.15 V, and 6.3 V.

FIG. 13(*a*) is a graph illustrating a ratio between a measured value obtained by using the measurement circuit illustrated in FIG. 4 and a calculated value obtained without employing the dimensionless coefficient 15 in accordance with the application rule 16, in terms of the equivalent series resistance ESR of the capacitor 1 held when the DC bias voltage v2 is applied at three levels of 0 V, 3.15 V, and 6.3 V. Meanwhile, FIG. 13(*b*) is a graph illustrating a ratio between the measured value obtained by using the measurement circuit illustrated in FIG. 4 and a calculated value obtained, through the deriving method of the present embodiment, by employing the dimensionless coefficient 15 in accordance with the application rule 16, in terms of the equivalent series resistance ESR of the capacitor 1 held when the DC bias voltage v2 is applied at three levels of 0 V, 3.15 V, and 6.3 V.

The horizontal axis of each of the graphs also indicates the frequency Hz, and the vertical axis indicates the ratio between the measured value and the calculated value (=measured value/calculated value). In addition, the ratio obtained when the DC bias voltage v2 is 0 V is indicated by a solid characteristics line 32*k*; the ratio obtained when the DC bias voltage v2 is 3.15 V is indicated by a dashed characteristics line 32*m*; and the ratio obtained when the DC bias voltage v2 is 6.3 V is indicated by a dotted characteristics line 32*n*.

With regard to the ratio between the measured value and the calculated value, according to the graph indicating the ratio between the measured value and the calculated value obtained without employing the dimensionless coefficient 15 as illustrated in FIG. 13(*a*), the characteristics lines 32*m* and 32*n* obtained when the DC bias voltage v2 is applied are not approximate to 1 in a lower frequency side. In the meantime, according to the graph indicating the ratio between the measured value and the calculated value obtained by employing the dimensionless coefficient 15 as illustrated in FIG. 13(*b*), the characteristics lines 32*m* and 32*n* obtained when the DC bias voltage v2 is applied could be made approximate to 1 throughout the entire frequency band.

Figure 14A:
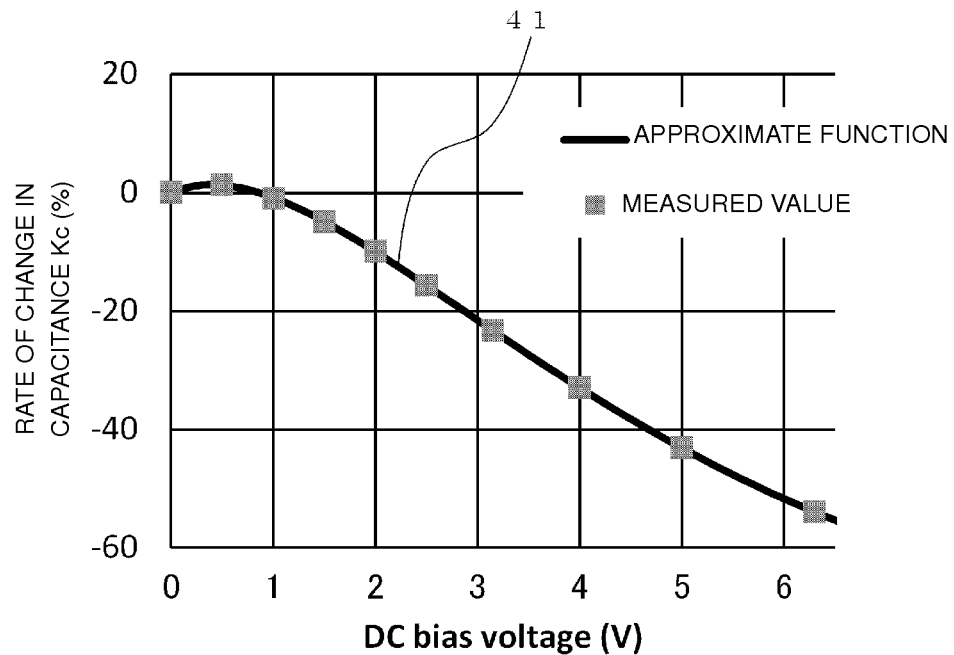
FIG. 14(a) is a graph illustrating a rate of change in the capacitance Kc of the capacitor indicated in Table 1 as an approximate function of the DC bias voltage to be applied to the capacitor.
Figure 14B:
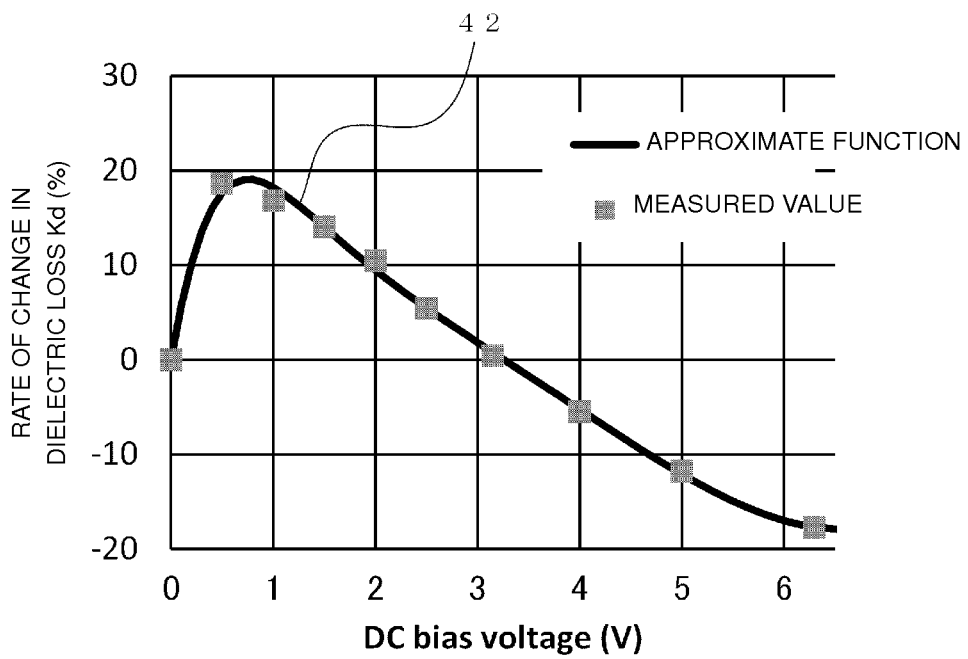
FIG. 14(b) is a graph illustrating a rate of change in the dielectric loss Kd of the capacitor indicated in Table 1 as an approximate function of the DC bias voltage to be applied to the capacitor.

FIG. 14(*a*) is a graph illustrating the rate of change in the capacitance Kc of the capacitor 1 indicated in Table 1 being expressed as an approximate function of the DC bias voltage v2 applied to the capacitor 1. Meanwhile, FIG. 14(*b*) is a graph illustrating the rate of change in the dielectric loss Kd of the capacitor 1 indicated in Table 1 being expressed as an approximate function of the DC bias voltage v2 applied to the capacitor 1.

The horizontal axis in each of the graphs indicates the DC bias voltage v2 V, and the vertical axes indicate the rate of change in the capacitance Kc % and the rate of change in the dielectric loss Kd %. In addition, the approximate function of the rate of change in the capacitance Kc is indicated by a characteristics line 41, and the approximate function of the rate of change in the dielectric loss Kd is indicated by a characteristics line 42. Furthermore, square plots indicate the measured values of the rate of change in the capacitance Kc and the rate of change in the dielectric loss Kd indicated in Table 1.

As the rate of change in the capacitance Kc and the rate of change in the dielectric loss Kd are expressed as the approximate functions above, the rate of change in the capacitance Kc and the rate of change in the dielectric loss Kd for any consecutive DC bias voltages v2 between the measured values obtained discretely as indicated in Table 1 can be complemented, and the dimensionless coefficient 15 for any consecutive DC bias voltages v2 can thus be obtained. Therefore, by multiplying the characteristic values of the resistive element R and the capacitive element C by the dimensionless coefficient 15 obtained as described above in accordance with the application rule 16 as described above, an equivalent circuit model for any consecutive DC bias voltages v2 can be derived, and the circuit characteristics can be calculated by using the derived equivalent circuit model.

The aforementioned approximate function is set to a function representing a general form as in the following expression (3) in the present embodiment. When setting this function, the conditions were set as follows: (i) the approximate function is expressed within a direct current voltage range that ranges from the rated voltage of 6.3 V of the capacitor 1 or lower to zero or higher, and discrete data at the rated voltage or lower can be complemented; (ii) a function value always takes a positive value and does not become zero or a negative value; and (iii) the function value becomes 1 when the DC bias voltage v2 applied to the capacitor 1 is zero.

Math. 3

$$k(x) = a^{f(x)} \tag{3}$$

The variable x in the above expression (3) represents the DC bias voltage v2, and the function f(x) is expressed through the following expression (4).

Math. 4

$$f(x) = b_1 g_1(x) + \ldots + b_N g_N(x) \tag{4}$$

The basis function $g_n(x)$ ($=g_1(x), g_2(x), \ldots, g_N(x)$) of the polynomial in the above expression (4) is linearly independent from one another, and the value thereof becomes zero when x=0. In addition, bn (=b1, b2, ..., bN) is an expansion coefficient, which will be described later. Typically, while a power of x ($x^n$) is often set as the basis function, a different basis function may be selected in a case in which the speed of conversion or the behavior of the function is to be restricted. In a case in which a power of x ($x^n$) is selected, the waveform may heave when the number of pieces of data is small, and thus the function indicated in the expression (5) is set as the basis function here, in place of a power of x ($x^n$).

Math. 5

$$g_1(x) = x, \tag{5}$$
$$g_n(x) = \frac{x}{\Delta x \cdot c^{n-2} + x} (n \geq 2, c > 0, \Delta x > 0)$$

In the above expression (5), n is a natural number that is equal to or greater than 2 (n≥2). In addition, c and Δx are constants, in which c>0 and Δx>0, and are undetermined coefficients that are to be adjusted in accordance with the slope (steepness) of the function. It is to be noted that the basis function indicated here is a setting example and, in reality, is not limited to such an example.

Figure 15:
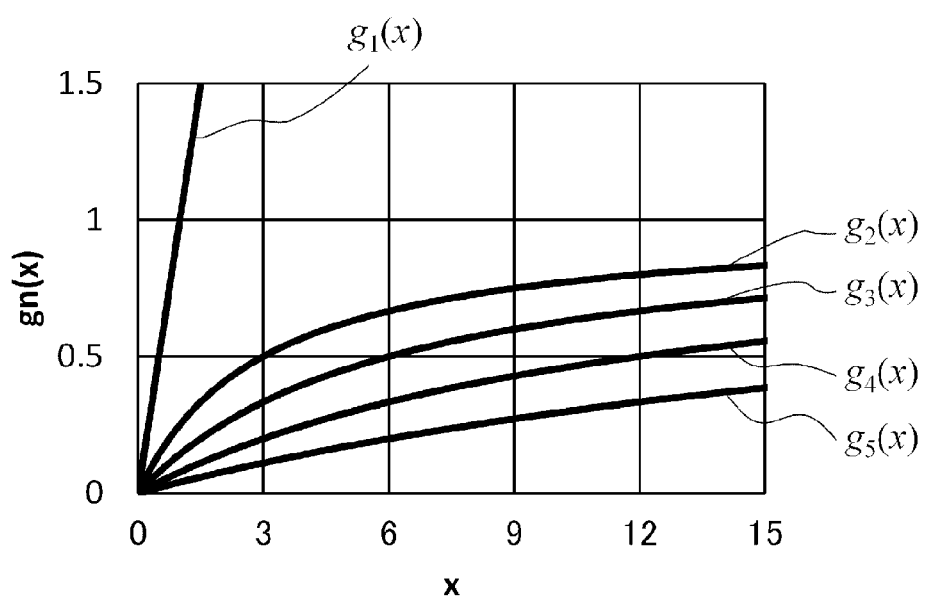
FIG. 15 is a graph illustrating a setting example of a basis function $g_n(x)$ forming an approximate function expressing the rate of change in the capacitance Kc and the rate of change in the dielectric loss Kd indicated in Table 1.

For example, when c=2 and Δx=3, the basis function $g_n(x)$ is expressed through the following expression (6), and when n=1 through 5, the basis function $g_n(x)$ is expressed as in the graph illustrated in FIG. 15.

Math. 6

$$g_1(x) = x, \tag{6}$$
$$g_n(x) = \frac{x}{3 \cdot 2^{n-2} + x} (n \geq 2)$$

The horizontal axis of the graph indicates the variable x representing the DC bias voltage v2, and the vertical axis indicates the value of the basis function $g_n(x)$. As indicated by the graph, $g_1(x)$ is linear, and $g_2(x), g_3(x), g_4(x)$, and $g_5(x)$ are curved so as to gradually approach a predetermined value. The rate of change in the capacitance Kc and the rate of change in the dielectric loss Kd gradually approach the predetermined value as the DC bias voltage v2 rises, as indicated by the graph illustrated in FIG. 14, and can thus be approximated through the basis function $g_n(x)$ above.

In addition, the characteristics curves of the approximate functions 41 and 42 of the rate of change in the capacitance Kc and the rate of change in the dielectric loss Kd illustrated in FIG. 14 have been obtained through expansion with the use of the basis function $g_n(x)$ of up to a quintic function as described above with the base a in the general form in the expression (3) set to 10 (a=10). Here, the expansion coefficient bn (n=1 through 5) has been derived by using a least-squares method. Table 2 below indicates the expansion coefficient bn (n=1 through 5) of each of the rate of change in the capacitance Kc and the rate of change in the dielectric loss Kd in the aforementioned case.

TABLE 2

| EXPANSION COEFFICIENT | RATE OF CHANGE IN CAPACITANCE (Kc) | RATE OF CHANGE IN DIELECTRIC LOSS (Kd) |
|---|---|---|
| b1 | 0.3937 | 4.6592 |
| b2 | 1.1074 | 18.9407 |
| b3 | −7.0378 | −136.7261 |
| b4 | 30.3051 | 455.3892 |
| b5 | −49.9964 | −620.4820 |

Thus, the approximate functions 41 and 42 of the rate of change in the capacitance Kc and the rate of change in the dielectric loss Kd are expressed through the approximate functions kc(x) and kd(x) of the expressions indicated as in the following expressions (7) and (8).

Math. 7

$$k_c(x) = 10^{f_c(x)}, \tag{7}$$
$$f_c(x) = 0.3937x + \frac{1.1074x}{3+x} - \frac{7.0378x}{6+x} + \frac{30.3051x}{12+x} - \frac{49.9964x}{24+x}$$

Math. 8

$$k_d(x) = 10^{f_d(x)}, \tag{8}$$
$$f_d(x) = 4.6592x + \frac{18.9407x}{3+x} - \frac{136.7261x}{6+x} + \frac{455.3892x}{12+x} - \frac{620.4820x}{24+x}$$

In such an equivalent circuit model according to the present embodiment illustrated in FIG. 3, as described above, the characteristic values of the resistive elements R2 to R6 and the capacitive elements C1, C7, and C8 forming the equivalent circuit model of the capacitor 1 change in response to the DC bias voltage v2 being applied to the capacitor 1, and such a change is attributable to the material of the dielectric 2 forming the capacitor 1. According to the method for deriving the equivalent circuit model of the present embodiment, however, by multiplying the characteristic values of the resistive elements R2 to R6 and the capacitive elements C1, C7, and C8, of which the characteristic values change in response to the DC bias voltage v2 being applied, held while the DC bias voltage v2 is not applied by the dimensionless coefficient 15 in accordance with the application rule 16 as described above, the characteristic values of the resistive elements R2 to R6 and the capacitive elements C1, C7, and C8 are corrected to values in accordance with the voltage of the DC bias voltage v2 applied to the capacitor 1. Therefore, unlike the existing method for deriving an equivalent circuit model of a capacitor, an equivalent circuit model does not need to be derived for each value of the DC bias voltage v2 superimposed and applied to the capacitor 1, and an equivalent circuit model having characteristics in accordance with the DC bias voltage v2 superimposed and applied to the capacitor 1 can be derived with high accuracy and with ease.

In addition, in the present embodiment, as illustrated in FIG. 2, the equivalent circuit model is formed by the main resonant circuit 11 and the secondary resonant circuit 12 serving as circuit elements, and the main resonant circuit 11 and the secondary resonant circuit 12 are each formed by a resistive element R, a capacitive element C, and an inductive element L. The characteristics of the capacitor 1 change as illustrated in FIG. 5(a) around the self resonant frequency or the secondary resonant frequency exceeding the self resonant frequency. According to the configuration described above, however, the equivalent circuit model includes the main resonant circuit 11 and the secondary resonant circuit 12 serving as circuit elements, and the main resonant circuit 11 and the secondary resonant circuit 12 are each formed by a resistive element R, a capacitive element C, and an inductive element L. Thus, the change in the characteristics can be simulated accurately.

In addition, in the present embodiment, as illustrated in FIG. 2, the equivalent circuit model is formed by the main resonant circuit 11, the secondary resonant circuit 12, the capacitive circuit 13, and the inductive circuit 14 that are connected in series. The main resonant circuit 11 is formed by connecting a resistive element R, a capacitive element C, and an inductive element L in series; the secondary resonant circuit 12 is formed by connecting a resistive element R, a capacitive element C, and an inductive element L in parallel; the capacitive circuit 13 is formed by connecting a resistive element R and a capacitive element C in parallel; and the inductive circuit 14 is formed by connecting a resistive element R and an inductive element L in parallel.

Through the configuration described above, with regard to the characteristics of the capacitor 1 simulated through the equivalent circuit model, as the equivalent circuit model is formed so as to include the main resonant circuit 11, in accordance with the material of the dielectric 2 of the capacitor 1, the characteristics of the capacitor 1 at a frequency around the self resonant frequency are corrected appropriately, as illustrated in FIG. 6. Additionally, as the equivalent circuit model is formed so as to include the capacitive circuit 13, in accordance with the material of the dielectric 2 of the capacitor 1, the characteristics at a frequency toward a lower frequency side of the self resonant frequency are corrected appropriately, as illustrated in FIG. 7. In addition, as the equivalent circuit model is formed so as to include the secondary resonant circuit 12, in accordance with the material of the dielectric of the capacitor 1, the characteristics at a frequency around the secondary resonant frequency exceeding the self resonant frequency are corrected appropriately, as illustrated in FIG. 8. Furthermore, as the equivalent circuit model is formed so as to include the inductive circuit 14, in accordance with the material of the dielectric 2 of the capacitor 1, the characteristics at a frequency toward a higher frequency side of the self resonant frequency are corrected appropriately, as illustrated in FIG. 9.

In addition, in the present embodiment, as in the application rule 16 described with reference to FIG. 3, the dimensionless coefficient 15 is expressed for the resistive elements R2 to R6 and the capacitive elements C1, C7, and C8, of which the characteristic values change in response to the DC bias voltage v2 being applied to the capacitor 1, on the basis of one or both of the rate of change in the capacitance Kc and the rate of change in the dielectric loss Kd of the capacitor 1, which are measured by applying the DC bias voltage v2 to the capacitor 1. The characteristic values of these elements are then corrected by multiplying the capacitance values of the capacitive elements C1, C7, and C8, of which the capacitance values change in accordance with the DC bias voltage v2, held while the DC bias voltage v2 is not applied and the resistance values of the resistive elements R2 to R6, of which the resistance values change in accordance with the DC bias voltage v2, held while the DC bias voltage v2 is not applied by the dimensionless coefficient 15.

Through the configuration described above, the capacitance values and the resistance values of the capacitive elements C1, C7, and C8 and the resistive elements R2 to R6, of which the characteristic values change in response to the DC bias voltage v2 being applied to the capacitor 1, are corrected appropriately to values in accordance with the DC bias voltage v2 to be superimposed and applied to the capacitor 1 as the characteristic values held while the DC bias voltage v2 is not applied to the capacitor 1 is multiplied by the dimensionless coefficient 15.

In addition, in the present embodiment, the rate of change in the capacitance Kc, which is a rate of change in the characteristic values of the capacitive elements C1, C7, and C8, and the rate of change in the dielectric loss Kd, which is a rate of change in the characteristic values of the resistive elements R2 to R6, are expressed, for example, through the expressions (7) and (8) as the approximate functions of the DC bias voltage v2 applied to the capacitor 1.

Through the configuration described above, as the rate of change in the capacitance Kc and the rate of change in the dielectric loss Kd, which are rates of changes in the characteristic values of capacitive elements C1, C7, and C8 and the resistive elements R2 to R6, are expressed through the approximate functions 41 and 42 as illustrated in FIG. 14, with regard to the characteristic values of capacitive elements C1, C7, and C8 and the resistive elements R2 to R6 forming the equivalent circuit model of the capacitor 1, values obtained discretely through the measurement as indicated in Table 1 are complemented and can thus be grasped continuously from the characteristic values held while the DC bias voltage v2 is not applied. Therefore, in each of the equivalent circuit models derived in accordance with the DC bias voltage v2 superimposed and applied to the capacitor 1, the continuity or the relationship with the equivalent circuit model obtained when the DC bias voltage v2 is not applied becomes clear, and thus the change in the characteristics arising while the DC bias voltage v2 is applied to the capacitor 1 up to the rated voltage thereof can be foreseen continuously.

In addition, in the present embodiment, the approximate function, of which the general form is indicated in the expressions (3) and (4), is expressed in a direct current voltage range that ranges from the rated voltage of the capacitor 1 or lower to zero or higher, and the function value always takes a positive value and becomes 1 when the DC bias voltage v2 applied to the capacitor 1 is zero. Through the configuration described above, the rate of change in the characteristic values of the resistive elements R2 to R6 and the capacitive elements C1, C7, and C8 forming the equivalent circuit model of the capacitor 1 is expressed through an approximate function in accordance with the actual use of the capacitor 1, and thus an appropriate circuit simulation can be carried out in accordance with the actual use.

In the preceding description of the embodiment, a case in which the dielectric 2 of the capacitor 1 is formed of ceramics has been described. The material of the dielectric 2 of the capacitor 1, however, is not limited to ceramics, and the present disclosure can be applied, in a similar manner, to a capacitor that is formed by a dielectric made of a different material.

In addition, in the preceding description of the embodiment, a case in which the characteristic values of the resistive elements R2 to R6 and the capacitive elements C1, C7, and C8 change in response to the DC bias voltage v2 being applied to the capacitor 1 has been described. Depending on the material of the dielectric 2 of the capacitor 1, however, there is a case in which the characteristic value of another resistive element R, capacitive element C, or inductive element L forming the equivalent circuit model changes. Even in such a case, as in the embodiment described above, by multiplying the characteristic value held while the DC bias voltage v2 is not applied by the dimensionless coefficient 15 in accordance with the application rule 16, the characteristics of each element are corrected appropriately to a value in accordance with the DC bias voltage v2 to be superimposed and applied to the capacitor 1.

In addition, in the preceding description of the embodiment, a case in which the equivalent circuit model is formed as an impedance expansion type equivalent circuit model by connecting the main resonant circuit 11, the secondary resonant circuit 12, the capacitive circuit 13, and the inductive circuit 14 in series, as illustrated in FIG. 2, has been described. The equivalent circuit model, however, may be formed by one of the aforementioned circuits in accordance with the material of the dielectric 2 of the capacitor 1. Alternatively, the equivalent circuit model may be formed by connecting some of the aforementioned circuits in series.

Figure 16:
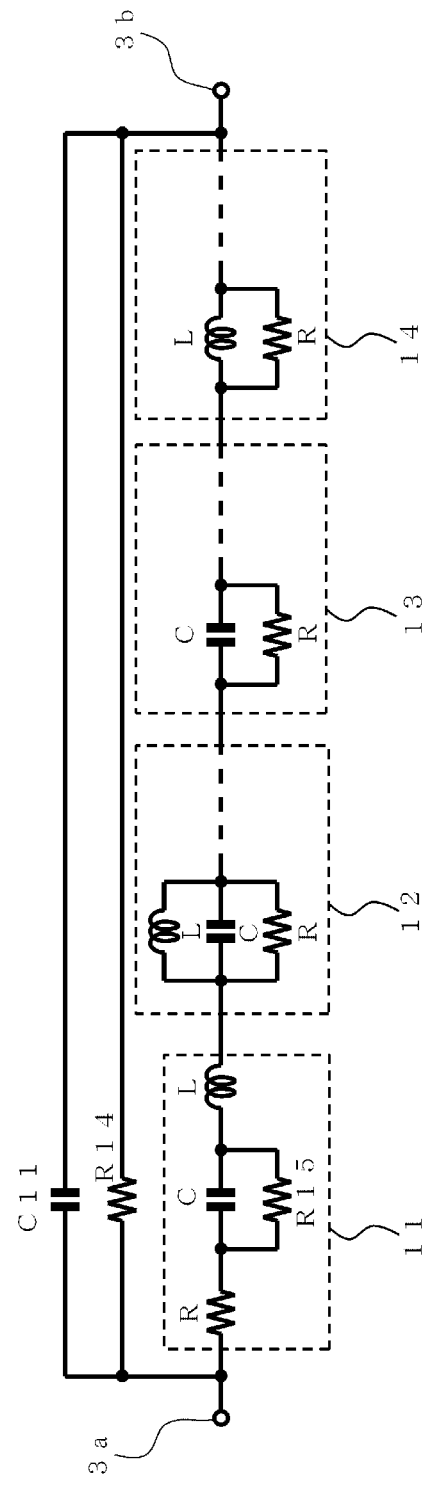
FIG. 16 is a circuit diagram according to a modification of the impedance expansion type equivalent circuit model illustrated in FIG. 3.

Meanwhile, as in an equivalent circuit model illustrated in FIG. 16, a resistive element R14 and a capacitive element C11, serving as floating components, may additionally be connected in parallel to the series circuit formed by the main resonant circuit 11, the secondary resonant circuit 12, the capacitive circuit 13, and the inductive circuit 14. In FIG. 16, portions that are identical to those illustrated in FIG. 2 are given identical reference characters, and descriptions thereof will be omitted. In addition, a resistive element R15, serving as an insulation resistance, may additionally be connected in parallel to the capacitive element C of the main resonant circuit 11. By adding the circuit element in this manner, the degree of freedom in adjusting the characteristics of the impedance expansion type equivalent circuit model improves.

Figure 17A:
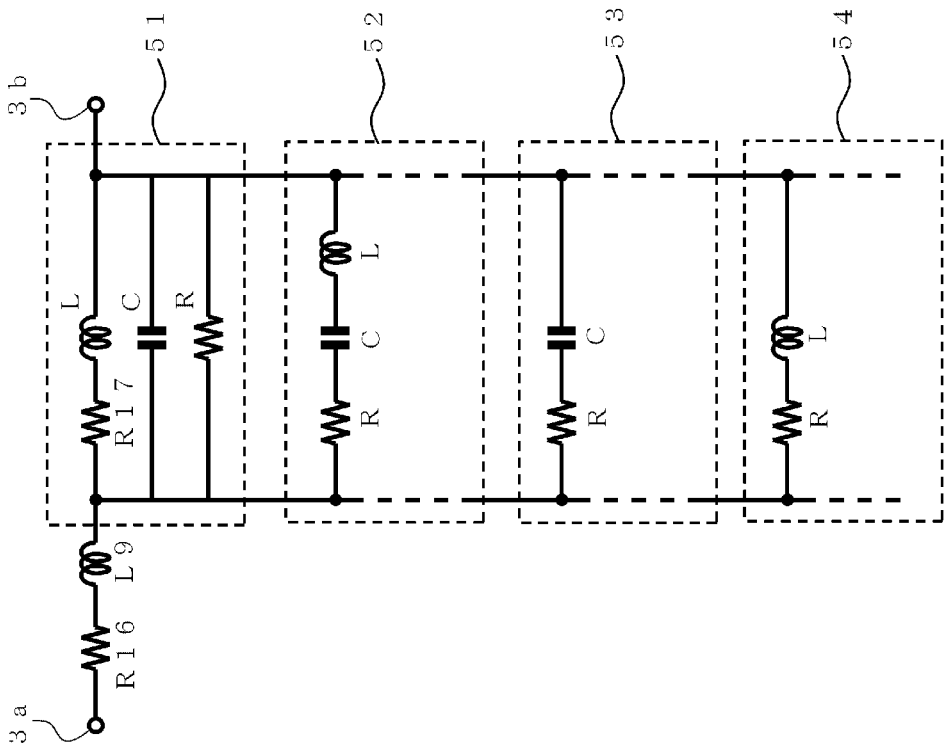
FIG. 17(a) is a circuit diagram of an admittance expansion type equivalent circuit model illustrating another example of the equivalent circuit model of the capacitor according to an embodiment of the present disclosure.

Alternatively, as illustrated in FIG. 17(a), the equivalent circuit model of an admittance expansion type may be formed by connecting a main resonant circuit 51, a secondary resonant circuit 52, a capacitive circuit 53, and an inductive circuit 54 in parallel between the electrode terminals 3a and 3b. The main resonant circuit 51 is formed by connecting a resistive element R, a capacitive element C, and an inductive element L in parallel; the secondary resonant circuit 52 is formed by connecting a resistive element R, a capacitive element C, and an inductive element L in series; the capacitive circuit 53 is formed by connecting a resistive element R and a capacitive element C in series; and the inductive circuit 54 is formed by connecting a resistive element R and an inductive element L in series. In addition, the equivalent circuit model may be formed by one of the aforementioned circuits in accordance with the material of the dielectric 2 of the capacitor 1. Alternatively, the equivalent circuit model may be formed by connecting some of the aforementioned circuits in series.

Through the configuration described above as well, with regard to the characteristics of the capacitor 1 to be simulated through the aforementioned equivalent circuit model, as the equivalent circuit model is formed so as to include the main resonant circuit 51, in accordance with the material of the dielectric 2 of the capacitor 1, the characteristics at a frequency around the self resonant frequency are corrected appropriately. Additionally, as the equivalent circuit model is formed so as to include the capacitive circuit 53, in accordance with the material of the dielectric 2 of the capacitor 1, the characteristics at a frequency toward a lower frequency side of the self resonant frequency are corrected appropriately. In addition, as the equivalent circuit model is formed so as to include the secondary resonant circuit 52, in accordance with the material of the dielectric 2 of the capacitor 1, the characteristics at a frequency around the secondary resonant frequency exceeding the self resonant frequency are corrected appropriately. Furthermore, as the equivalent circuit model is formed so as to include the inductive circuit 54, in accordance with the material of the dielectric 2 of the capacitor 1, the characteristics at a frequency toward a higher frequency side of the self resonant frequency are corrected appropriately.

As in the embodiment described above, by multiplying the characteristic value of the resistive element R, the capacitive element C, or the inductive element L, of which the characteristic value changes in response to the DC bias voltage v2 being applied to the capacitor 1, held while the DC bias voltage v2 is not applied by a dimensionless coefficient in accordance with a predetermined application rule, the characteristic value of the resistive element R, the capacitive element C, or the inductive element L, of which the characteristic value changes in accordance with the DC bias voltage v2, is corrected to a value in accordance with the voltage of the DC bias voltage v2 applied to the capacitor 1.

Figure 17B:
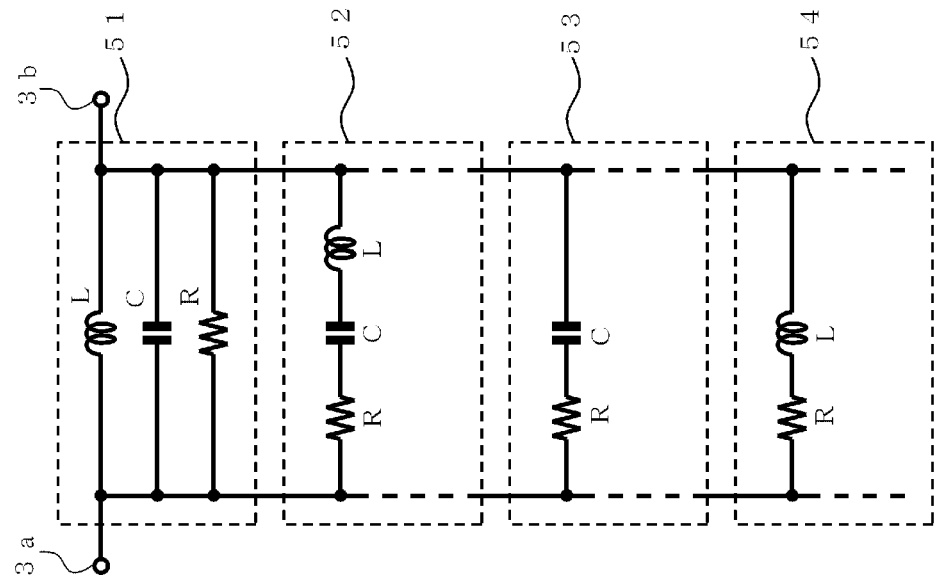
FIG. 17(b) is a circuit diagram according to a modification of the admittance expansion type equivalent circuit model illustrated in FIG. 17(a).

In addition, as in an equivalent circuit model illustrated in FIG. 17(b), the equivalent circuit model may be formed by additionally connecting a resistive element R16 and an inductive element L9, serving as floating components, in series to each of the circuits. In addition, a resistive element R17, serving as an insulation resistance, may additionally be connected in series to the inductive element L of the main resonant circuit 51. By adding the circuit element in this manner, the degree of freedom in adjusting the characteristics of the admittance expansion type equivalent circuit model improves.

INDUSTRIAL APPLICABILITY

The method for deriving an equivalent circuit model according to the present embodiment described above can be implemented with ease by using the following computer program. The computer program includes a first step of inputting the type of the capacitor 1 to be used for designing an electronic circuit, a second step of inputting the value of the DC bias voltage v2 to be applied to the capacitor 1, and a third step of multiplying the characteristic value of a circuit element forming the equivalent circuit model of the capacitor 1 of the type inputted in the first step held while the DC bias voltage v2 is not applied by the dimensionless coefficient 15 that is prepared in advance in a memory for the capacitor 1 of the type inputted in the first step, as in the present embodiment described above, and correcting the characteristic value of the circuit element to a value in accordance with the DC bias voltage v2 inputted in the second step, and thus the method for deriving the equivalent circuit model according to the present embodiment described above is made functional.

The method for deriving the equivalent circuit model of the capacitor according to the present embodiment is made functional by the computer program simply as the type of the capacitor 1 to be simulated and the value of the DC bias voltage v2 to be applied to the capacitor 1 are inputted to the computer program, as described above. Therefore, the characteristic value of the circuit element forming the equivalent circuit model of the capacitor 1 of the inputted type is automatically corrected to a value in accordance with the inputted value of the DC bias voltage v2 by the computer program as the characteristic value held while the DC bias voltage v2 is not applied is multiplied by the dimensionless coefficient 15 prepared in advance for the capacitor 1 of the inputted type. Thus, a user of the deriving method can carry out an appropriate circuit simulation with high accuracy and with ease only by inputting the type of the capacitor 1 to be simulated and the value of the DC bias voltage v2 to be applied to the capacitor 1 to the computer program. As a result, even a general user who does not have specialized knowledge on a circuit simulation can carry out an appropriate circuit simulation for an electronic circuit that includes the capacitor 1 with high accuracy and with ease.

In addition, the computer program described above can be used from a terminal, such as a personal computer, connected to the Internet by accessing a server of an electronic component manufacturer or the like provided with the computer program through the Internet. Through the configuration described above, the user can use the computer program with ease by accessing the server provided with the computer program from a terminal connected to the Internet. Accordingly, the method for deriving the equivalent circuit model of the capacitor according to the present embodiment can be provided to a large number of users.

The invention claimed is:

1. A method for deriving an equivalent circuit model of a capacitor that is formed by a resistive element, a capacitive element, and an inductive element, the method comprising:
expressing, by a computer, a rate of change in a characteristic value of a voltage-dependent element being one of the resistive element, the capacitive element, and the inductive element, the voltage-dependent element having a value that changes as a direct current voltage is applied to the capacitor, the value being a dimensionless coefficient on the basis of a rate of change in the characteristics of the capacitor attributable to a material of the capacitor;
multiplying, by the computer, the characteristic value of the element, of which the characteristic value changes in response to the direct current voltage being applied to the capacitor, held while the direct current voltage is not applied by the dimensionless coefficient; and
correcting, by the computer, the characteristic value of the element to a value in accordance with the direct current voltage applied to the capacitor,
wherein the equivalent circuit model is formed by one of a main resonant circuit, a secondary resonant circuit, a capacitive circuit, and an inductive circuit, the main resonant circuit being formed by connecting a resistive element, a capacitive element, and an inductive element in series, the secondary resonant circuit being formed by connecting a resistive element, a capacitive element, and an inductive element in parallel, the capacitive circuit being formed by connecting a resistive element and a capacitive element in parallel, the inductive circuit being formed by connecting a resistive element and an inductive element in parallel; or the equivalent circuit model is formed by connecting some of the main resonant circuit, the secondary resonant circuit, the capacitive circuit, and the inductive circuit in series.

2. The method for deriving the equivalent circuit model of the capacitor according to claim 1,
wherein the dimensionless coefficient is expressed for the capacitive element or the resistive element, of which the characteristic value changes in response to the direct current voltage being applied to the capacitor, on the basis of one or both of a rate of change in the capacitance and a rate of change in the dielectric loss of the capacitor measured by applying the direct current voltage to the capacitor, and
wherein the correction is carried out by multiplying a capacitance value of the capacitive element, of which the capacitance value changes in response to the direct current voltage being applied to the capacitor, held while the direct current voltage is not applied or a resistance value of the resistive element, of which the resistance value changes in response to the direct current voltage being applied to the capacitor, held while the direct current voltage is not applied by the dimensionless coefficient.

3. The method for deriving the equivalent circuit model of the capacitor according to claim 2, wherein the dimensionless coefficient is set to the rate of change in the capacitance for the capacitive elements forming the main resonant circuit and the secondary resonant circuit, is set to a value obtained by dividing the rate of change in the capacitance by the rate of change in the dielectric loss for the capacitive element forming the capacitive circuit, and is set to a value obtained by dividing the rate of change in the dielectric loss by the rate of change in the capacitance for the resistive element forming the capacitive circuit or the inductive circuit.

4. The method for deriving the equivalent circuit model of the capacitor according to claim 1, wherein the rate of change in the characteristic value of the element is expressed as an approximate function of the direct current voltage applied to the capacitor.

5. The method for deriving the equivalent circuit model of the capacitor according to claim 4, wherein the approximate function is expressed within a direct current voltage range that ranges from a rated voltage of the capacitor or lower to zero or higher, and a function value always takes a positive value and becomes 1 when the direct current voltage applied to the capacitor is zero.

6. The method for deriving the equivalent circuit model of a capacitor that is formed by a resistive element, a capacitive element, and an inductive element, the method comprising:
expressing, by a computer, a rate of change in a characteristic value of a voltage-dependent element being one of the resistive element, the capacitive element, and the inductive element, the voltage-dependent element having a value that changes as a direct current voltage is applied to the capacitor, the value being a dimensionless coefficient on the basis of a rate of change in the characteristics of the capacitor attributable to a material of the capacitor;
multiplying, by the computer, the characteristic value of the element, of which the characteristic value changes in response to the direct current voltage being applied to the capacitor, held while the direct current voltage is not applied by the dimensionless coefficient; and
correcting, by the computer, the characteristic value of the element to a value in accordance with the direct current voltage applied to the capacitor,
wherein the equivalent circuit model is formed by one of a main resonant circuit, an secondary resonant circuit, a capacitive circuit, and an inductive circuit, the main resonant circuit being formed by connecting a resistive element, a capacitive element, and an inductive element in parallel, the secondary resonant circuit being formed by connecting a resistive element, a capacitive element, and an inductive element in series, the capacitive circuit being formed by connecting a resistive element and a capacitive element in series, the inductive circuit being formed by connecting a resistive element and an inductive element in series; or the equivalent circuit model is formed by connecting some of the main resonant circuit, the secondary resonant circuit, the capacitive circuit, and the inductive circuit in parallel.

* * * * *